United States Patent
Kishi

(10) Patent No.: US 7,308,240 B2
(45) Date of Patent: Dec. 11, 2007

(54) NUMERICAL CONTROL OSCILLATOR, DIGITAL FREQUENCY CONVERTER AND RADIO FREQUENCY UNIT

(75) Inventor: Takahiko Kishi, Yokohama (JP)

(73) Assignee: Samsung Electronics Co., Ltd. (KR)

( * ) Notice: Subject to any disclaimer, the term of this patent is extended or adjusted under 35 U.S.C. 154(b) by 617 days.

(21) Appl. No.: 10/733,526

(22) Filed: Dec. 11, 2003

(65) Prior Publication Data

US 2004/0120425 A1 Jun. 24, 2004

(30) Foreign Application Priority Data

Dec. 11, 2002 (JP) .............................. 2002-359773

(51) Int. Cl.
*H04B 7/00* (2006.01)
(52) U.S. Cl. ...................... 455/255; 455/258; 375/326; 375/324; 375/346; 375/316; 375/302; 375/304; 375/306
(58) Field of Classification Search ................ 455/255, 455/258, 266, 114.2, 230; 375/302, 304, 375/306, 142
See application file for complete search history.

(56) References Cited

U.S. PATENT DOCUMENTS 4,860,018 A * 8/1989 Counselman, III ..... 342/357.12

(Continued)

FOREIGN PATENT DOCUMENTS

CN 1355655 6/2002

(Continued)

OTHER PUBLICATIONS

Henry T. Nicholas, III et al., "An Analysis of the Output Spectrum of Direct Digital Frequency Synthesizers in the Presence of Phase-Accumulator Truncation", 41st Annual Frequency Control Symposium—1987, pp. 495-502.

(Continued)

*Primary Examiner*—Nay Maung
*Assistant Examiner*—Richard Chan
(74) *Attorney, Agent, or Firm*—The Farrell Law Firm, P.C.

(57) ABSTRACT

A numerical control oscillator (NCO) for reducing a circuit size and power consumption while maintaining a desired frequency deviation, and suppressing generation of a spurious as much as possible. The NCO comprises a phase accumulator for accumulating input phase difference data to generate phase data, and a read only memory (ROM) for storing a phase/amplitude conversion table to output amplitude data corresponding to the phase data generated by the phase accumulator. The phase accumulator includes a phase register and a phase calculator. If a sampling frequency of an output signal from the NCO is Fs, the upper limit of a desired frequency setting interval of the output signal is FD and K and L are arbitrary integers, the phase calculator adds or subtracts the input phase difference data and phase data from the phase register to or from each other by a modulo operation taking the nearest integer of M as a modulus, where $M=Fs/FD \times K/L$. The ROM has its address terminal connected to an output terminal of the phase accumulator. On the basis of the stored phase/amplitude conversion table, the ROM outputs amplitude data corresponding to phase data, input from the phase accumulator to the address terminal, through its data terminal as an output signal of the NCO set to a frequency setting interval of a dF step, where $dF=FD/K \times L$.

27 Claims, 9 Drawing Sheets

U.S. PATENT DOCUMENTS

| | | | |
|---|---|---|---|
| 4,870,422 A * | 9/1989 | Counselman, III | 342/357.12 |
| 5,038,120 A * | 8/1991 | Wheatley et al. | 332/128 |
| 5,202,846 A | 4/1993 | Rasmussen et al. | |
| 5,371,765 A | 12/1994 | Guilford | |
| 5,619,535 A * | 4/1997 | Alvarez, Jr. | 375/308 |
| 5,822,376 A * | 10/1998 | Renard | 375/316 |
| 5,890,051 A * | 3/1999 | Schlang et al. | 455/76 |
| 6,236,278 B1 * | 5/2001 | Olgaard | 331/25 |
| 6,463,266 B1 | 10/2002 | Shohara | |
| 6,584,145 B1 * | 6/2003 | Carnagna et al. | 375/216 |
| 6,671,339 B1 * | 12/2003 | Ahn | 375/346 |
| 6,696,886 B1 * | 2/2004 | Ke et al. | 327/553 |
| 6,781,473 B1 * | 8/2004 | Chiu et al. | 331/177 R |
| 7,064,616 B2 * | 6/2006 | Reichert | 331/1 A |
| 7,085,309 B2 * | 8/2006 | Oesch et al. | 375/142 |
| 2002/0048325 A1 | 4/2002 | Takahiko | |
| 2004/0120425 A1 * | 6/2004 | Kishi | 375/327 |

FOREIGN PATENT DOCUMENTS

| | | |
|---|---|---|
| DE | 44 40 510 A1 | 11/1994 |
| EP | 0 907 121 A2 | 4/1999 |

OTHER PUBLICATIONS

Jouko Vankka, "Spur Reduction Techniques in Sine Output Direct Digital Synthesis", 1996 IEEE International Frequency Control Symposium, pp. 951-959.

European Search Report dated Mar. 16, 2004 issued in a counterpart application, namely, Appln. No. 03028172.9.

* cited by examiner

NUMERICAL CONTROL OSCILLATOR, DIGITAL FREQUENCY CONVERTER AND RADIO FREQUENCY UNIT

PRIORITY

This application claims priority under 35 U.S.C. § 119 to an application entitled "Numerical Control Oscillator, Digital frequency Converter and Radio Frequency Unit" filed in the Japanese Intellectual Property Office on Dec. 11, 2002 and assigned Serial No. 359773/2002, the contents of which are incorporated herein by reference.

BACKGROUND OF THE INVENTION

1. Field of the Invention

The present invention relates to a numerical control oscillator for frequency-converting a received signal into a demodulator input signal through a digital signal process, and a digital frequency converter and radio frequency unit including the same.

2. Description of the Related Art

A conventional numerical control oscillator (NCO) includes a phase data accumulator, and a memory (for example, a read only memory (ROM)) for outputting sine data corresponding to a phase calculated by the accumulator. Further, the NCO provides an output frequency defined as follows in Equation (1):

$$F = (Fs \times R)/2^j \qquad (1)$$

where, F is the output frequency, j is a phase word length, Fs is a sampling frequency, and R is an arbitrary integer.

In the case where a target frequency is obtained using a direct digital synthesizer (DDS) that digital/analog-converts and outputs an output signal from the NCO, the output frequency of the NCO can be changed at a 200 KHz step by adjusting the sampling frequency of the output signal from the NCO to 200 KHz×$2^j$ or extending the phase word length j (increasing the number of bits) to enhance a phase resolution, or frequency resolution, so that the difference between the target frequency and the output frequency of the NCO is within a range of an allowable deviation For example, provided that the sampling frequency Fs is set to 153.6 MHz in a system where the output frequency F is 1.92 GHz and the allowable output frequency deviation Δf is taken at a degree of precision of 0.1 ppm, the phase word length j will be taken as follows in Equation (2):

$$\begin{aligned} j &= \log_2(Fs/\Delta f) \qquad (2) \\ &= \log_2(153.6 \times 10^6 / (1.92 \times 10^9 \times 0.1 \times 10^{-6})) \\ &\approx 19.61 \end{aligned}$$

It can be seen from the above Equation (2) that 20 bits are required to define the target phase word length j.

However, in the case where the phase word length j is extended, it is necessary to make the phase word length j equal to a word length k of the memory (the number of address bits of the memory) (j=k) in order to obtain an output signal of the NCO with no spurious effects caused by truncation of phase data. In the case of making the phase word length j larger than the memory word length k (j>k) in order to suppress an increase in memory size, it is necessary to requantize an address word length (memory word length) output from a phase calculator. This requantization causes the occurrence of an error $e^p$ of periodicity, which appears as a spurious in the output signal of the NCO (see Henry T Nicholas, III and Henry Samueli, "An Analysis of the Output Spectrum of Direct Digital Frequency Synthesizers in the Phase-Accumulator Truncation" in Proc. Annual Frequency Control Symposium, 1987, pp 495-502 (reference 1), for example).

On the other hand, known as a method for suppressing the spurious resulting from the requantization of the address word length from the phase calculator is, for example, a method based on an error feedback or error spread by design (see Jouko Vankka, "Spur. Reduction Techniques in Sine Output Direct Digital Synthesis" in IEEE International Frequency Control Symposium, 1996, pp 951-959 (reference 2), for example). However, as disclosed in reference 1, although the spurious is generated in the output signal due to the requantization of the address word length from the phase calculator, the phase word length j inevitably becomes larger than the memory word length k in order to suppress an increase in memory size.

Further, the techniques disclosed in reference 2 are disadvantageous in that additional circuits are required besides the original target circuits, resulting in an increase in circuit size even though the memory size is not increased. The method for suppressing the spurious using the error spread by design involves an increase in noise level (noise floor), so it is not necessarily effective.

Moreover, setting the sampling frequency to $2^j$ times a desired frequency step makes it difficult to generate a reference frequency.

SUMMARY OF THE INVENTION

Therefore, the present invention has been designed in view of the above and other problems, and it is an object of the present invention to provide a numerical control oscillator for reducing a circuit size and power consumption while maintaining a desired frequency deviation, and suppressing generation of a spurious effects as much as possible, and a digital frequency converter and radio frequency unit including the same.

In accordance with a first aspect of the present invention, the above and other objects can be accomplished by a numerical control oscillator (NCO) comprising: a phase accumulator for accumulating input phase difference data to generate phase data, the phase accumulator including a register for storing and outputting the phase data, and a calculator for adding or subtracting the input phase difference data and the phase data from the register to or from each other; and a memory for storing a phase/amplitude conversion table to output amplitude data corresponding to the phase data generated by the phase accumulator, the NCO being adapted to output a signal of a sampling frequency Fs, wherein: if an upper limit of a desired frequency setting interval of an output signal is FD and K and L are arbitrary integers, the calculator of the phase accumulator is adapted to add or subtract the input phase difference data and the phase data from the register to or from each other by a modulo operation taking a nearest integer of M as a modulus, where M=Fs/FD×K/L; and the phase/amplitude conversion table is adapted to output a signal set to a frequency setting interval of a dF step, where dF=FD/K×L.

In the NCO with the above-described configuration, if the sampling frequency of the output signal from the NCO is Fs, the upper limit of the desired frequency setting interval of the output signal is FD and K and L are arbitrary integers, the phase/amplitude conversion table includes M (integral M, where M=Fs/FD×K/L) amplitude data, and the phase accumulator generates phase data by accumulatively adding or subtracting the input phase difference data by a modulo operation taking the integral M as a modulus, and outputs the generated phase data as an address input to the phase/amplitude conversion table. As a result, the phase/amplitude conversion table outputs amplitude data corresponding to the input phase data as an output signal of the NCO set to the frequency setting interval of the dF step, where dF=FD/K×L.

In accordance with a second aspect of the present invention, there is provided a digital down-converter comprising a frequency converter including the NCO of the first aspect as a local oscillator and serving to frequency-convert an input signal sampled at the sampling frequency Fs, the digital down-converter converting and outputting the input signal into an output signal with a frequency lower than that of the input signal, wherein, if a desired frequency setting interval of the input signal is FD and K and L are arbitrary integers, the frequency converter is adapted to frequency-convert the input signal using a specific signal output from the local oscillator and set to a frequency setting interval of a dF step, where dF=FD/K×L, the local oscillator outputting the specific signal by accumulating the phase difference data by a modulo operation taking a nearest integer of M as a modulus, where M=Fs/FD×K/L.

In the digital down-converter with the above-described configuration, in order to convert and output the input signal sampled at the sampling frequency Fs into an output signal with a frequency lower than that of the input signal, if the desired frequency setting interval of the input signal is FD and K and L are arbitrary integers, the frequency converter frequency-converts the input signal using a frequency signal output from the NCO of the first aspect as the local oscillator and set to the frequency setting interval of the dF step, where dF=FD/K×L. In the case where the desired frequency setting interval FD of the input signal is higher than or equal to the frequency setting interval dF of the frequency converter and is evenly divisible by it, the digital down-converter can convert the frequency of the input signal input thereto at the frequency setting interval FD into a desired frequency within the range of an allowable frequency deviation.

In accordance with a third aspect of the present invention, there is provided a digital down-converter comprising a first frequency converter including the NCO of the first aspect as a first local oscillator and serving to frequency-convert an input signal sampled at a sampling frequency Fs1, and a second frequency converter including the NCO of the first aspect as a second local oscillator and serving to secondarily frequency-convert an output signal from the first frequency converter, the digital down-converter converting and outputting the input signal into an output signal with a frequency lower than that of the input signal by two frequency conversions, wherein: if a desired frequency setting interval of the input signal is FD and K1, K2 and L1 are arbitrary integers, the first frequency converter is adapted to frequency-convert the input signal using a first specific signal output from the first local oscillator and set to a frequency setting interval of an FD1 step, where FD1=FD/K1×L1, the first local oscillator outputting the first specific signal by accumulating the phase difference data by a modulo operation taking a nearest integer of M1 as a modulus, where M1=Fs1/FD×K1/L1; and the second frequency converter is adapted to, if a sampling frequency of the output signal from the first frequency converter is Fs2, frequency-convert the output signal from the first frequency converter using a second specific signal output from the second local oscillator and set to a frequency setting interval of an FD2 step, where FD2=(FD mod FD1)/K2, the second local oscillator outputting the second specific signal by accumulating the phase difference data by a modulo operation taking a nearest integer of M2 as a modulus, where M2=Fs2/(FD mod FD1)×K2.

The digital down-converter with the above-described configuration converts and outputs the input signal sampled at the sampling frequency Fs1 into an output signal with a frequency lower than that of the input signal by two frequency conversions. If the desired frequency setting interval of the input signal is FD, K1, K2 and L1 are arbitrary integers and the frequency setting interval FD is above the frequency setting interval FD1 of the first frequency converter and is indivisible by it, the frequency deviation of the output signal from the digital down-converter will exceed an allowable range. For this reason, first, the first frequency converter frequency-converts the input signal using a frequency signal output from the NCO of the first aspect as the first local oscillator and set to the frequency setting interval of the FD1 step, where FD1=FD/K1×L1. Then, the second frequency converter secondarily frequency-converts the output signal from the first frequency converter using a frequency signal output from the NCO of the first aspect as the second local oscillator and set to the frequency setting interval of the FD2 step, where FD2=(FD mod FD1)/K2. Therefore, the digital down-converter can convert the frequency of the input signal input thereto at the frequency setting interval FD into a desired frequency within the range of an allowable frequency deviation.

In accordance with a fourth aspect of the present invention, there is provided a digital down-converter comprising a first frequency converter including the NCO of the first aspect as a first local oscillator and serving to frequency-convert an input signal sampled at a sampling frequency Fs1, and a second frequency including the NCO of the first aspect as a second local oscillator and serving to secondarily frequency-convert an output signal from the first frequency converter, the digital down-converter converting and outputting the input signal into an output signal with a frequency lower than that of the input signal by two frequency conversions, wherein: if a desired frequency setting interval of the input signal is FD and K1, K2 and L1 are arbitrary integers, the first frequency converter is adapted to frequency-convert the input signal using a first specific signal output from the first local oscillator and set to a frequency setting interval of an FD1 step, where FD1=FD/K1×L1, the first local oscillator outputting the first specific signal by accumulating the phase difference data by a modulo operation taking a nearest integer of M1 as a modulus, where M1=Fs1/FD×K1/L1; and the second frequency converter is adapted to, if a sampling frequency of the output signal from the first frequency converter is Fs2, frequency-convert the output signal from the first frequency converter using a second specific signal output from the second local oscillator and set to a frequency setting interval of an FD2 step, where FD2=(FD1 mod FD)/K2, the second local oscillator outputting the second specific signal by accumulating the phase difference data by a modulo operation taking a nearest integer of M2 as a modulus, where M2=Fs2/(FD1 mod FD)×K2.

The digital down-converter with the above-described configuration converts and outputs the input signal sampled at the sampling frequency Fs1 into an output signal with a frequency lower than that of the input signal by two frequency conversions. If the desired frequency setting interval of the input signal is FD, K1, K2 and L1 are arbitrary integers and the frequency setting interval FD is below the frequency setting interval FD1 of the first frequency converter and FD1 is indivisible by FD, the frequency deviation of the output signal from the digital down-converter will exceed an allowable range. For this reason, first, the first frequency converter frequency-converts the input signal using a frequency signal output from the NCO of the first aspect as the first local oscillator and set to the frequency setting interval of the FD1 step, where FD1=FD/K1×L1. Then, the second frequency converter secondarily frequency-converts the output signal from the first frequency converter using a frequency signal output from the NCO of the first aspect as the second local oscillator and set to the frequency setting interval of the FD2 step, where FD2=(FD1 mod FD)/K2. Therefore, the digital down-converter can convert the frequency of the input signal input thereto at the frequency setting interval FD into a desired frequency within the range of an allowable frequency deviation.

In accordance with a fifth aspect of the present invention, there is provided a digital down-converter comprising a first frequency converter including the NCO of the first aspect as a first local oscillator and serving to frequency-convert an input signal sampled at a sampling frequency Fs1, and a second frequency converter including the NCO of the first aspect as a second local oscillator and serving to secondarily frequency-convert an output signal from the first frequency converter, the digital down-converter converting and outputting the input signal into an output signal with a frequency lower than that of the input signal by two frequency conversions, wherein: if a desired frequency setting interval of the input signal is FD and K1, K2 and L1 are arbitrary integers, the first frequency converter is adapted to frequency-convert the input signal using a first specific signal output from the first local oscillator and set to a frequency setting interval of an FD1 step, where FD1=FD/K1×L1, the first local oscillator outputting the first specific signal by accumulating the phase difference data by a modulo operation taking a nearest integer of M1 as a modulus, where M1=Fs1/FD×K1/L1; and the second frequency converter is adapted to, if a sampling frequency of the output signal from the first frequency converter is Fs2, frequency-convert the output signal from the first frequency converter using a second specific signal output from the second local oscillator and set to a frequency setting interval of an FD2 step, where FD2=FD/K2, the second local oscillator outputting the second specific signal by accumulating the phase difference data by a modulo operation taking a nearest integer of M2 as a modulus, where M2=Fs2/FD×K2.

The digital down-converter with the above-described configuration converts and outputs the input signal sampled at the sampling frequency Fs1 into an output signal with a frequency lower than that of the input signal by two frequency conversions. If the desired frequency setting interval of the input signal is FD, K1, K2 and L1 are arbitrary integers, and the frequency setting interval FD is higher than or equal to the frequency setting interval FD1 of the first frequency converter and is evenly divisible by it, or FD is lower than FD1 and FD1 is evenly divisible by FD, first, the first frequency converter frequency-converts the input signal using a frequency signal output from the NCO of the first aspect as the first local oscillator and set to the frequency setting interval of the FD1 step, where FD1=FD/K1×L1. Then, the second frequency converter secondarily frequency-converts the output signal from the first frequency converter using a frequency signal output from the NCO of the first aspect as the second local oscillator and set to the frequency setting interval of the FD2 step, where FD2=FD/K2. Therefore, the digital down-converter can convert the frequency of the input signal input thereto at the frequency setting interval FD into a desired frequency within the range of an allowable frequency deviation.

Preferably, in the digital down-converter of the third, fourth, or fifth aspect, the second frequency converter may stop its frequency conversion.

In the case where a multiple of the frequency setting interval FD1 of the first frequency converter is equal to that of the frequency setting interval FD of the input signal, the digital down-converter with the above-described configuration can convert the frequency of the input signal input thereto at the frequency setting interval FD into a desired frequency within the range of an allowable frequency deviation by means of only the first frequency converter.

In accordance with a sixth aspect of the present invention, there is provided a digital up-converter comprising a frequency converter including the NCO of the first aspect as a local oscillator and serving to frequency-convert an input signal, the digital up-converter converting the input signal into a signal with a frequency higher than that of the input signal and outputting the converted signal as an output signal sampled at the sampling frequency Fs, wherein, if a desired frequency setting interval of the output signal is FD and K and L are arbitrary integers, the frequency converter is adapted to frequency-convert the input signal using a specific signal output from the local oscillator and set to a frequency setting interval of a dF step, where dF=FD/K×L, the local oscillator outputting the specific signal by accumulating the phase difference data by a modulo operation taking a nearest integer of M as a modulus, where M=Fs/FD×K/L.

In the digital up-converter with the above-described configuration, in order to convert the input signal into a signal with a frequency higher than that of the input signal and output the converted signal as an output signal sampled at the sampling frequency Fs, if the desired frequency setting interval of the output signal is FD and K and L are arbitrary integers, the frequency converter frequency-converts the input signal using a frequency signal output from the NCO of the first aspect as the local oscillator and set to the frequency setting interval of the dF step, where dF=FD/K×L. In the case where the desired frequency setting interval FD of the output signal is higher than or equal to the frequency setting interval dF of the frequency converter and is evenly divisible by it, the digital up-converter can set the frequency setting interval of its output signal to FD.

In accordance with a seventh aspect of the present invention, there is provided a digital up-converter comprising a first frequency converter including the NCO of the first aspect as a first local oscillator and serving to frequency-convert an input signal, and a second frequency converter including the NCO of the first aspect as a second local oscillator and serving to secondarily frequency-convert an output signal from the first frequency converter, the digital up-converter performing two frequency conversions to convert the input signal into a signal with a frequency higher than that of the input signal and output the converted signal as an output signal sampled at a sampling frequency Fs2, wherein: if a desired frequency setting interval of the output signal is FD and K1, K2 and L2 are arbitrary integers, the second frequency converter is adapted to frequency-convert the output signal from the first frequency converter using a first specific signal output from the second local oscillator and set to a frequency setting interval of an FD2 step, where FD2=FD/K2×L2, the second local oscillator outputting the first specific signal by accumulating the phase difference data by a modulo operation taking a nearest integer of M2 as a modulus, where $M2=Fs2/FD \times K2/L2$; and the first frequency converter is adapted to, if a sampling frequency of the input signal is Fs1, frequency-convert the input signal using a second specific signal output from the first local oscillator and set to a frequency setting interval of an FD1 step, where $FD1=(FD \bmod FD2)/K1$, the first local oscillator outputting the second specific signal by accumulating the phase difference data by a modulo operation taking a nearest integer of M1 as a modulus, where $M1=Fs1/(FD \bmod FD2) \times K1$.

The digital up-converter with the above-described configuration performs two frequency conversions to convert the input signal into a signal with a frequency higher than that of the input signal and output the converted signal as an output signal sampled at the sampling frequency Fs2. If the desired frequency setting interval of the output signal is FD, K1, K2 and L2 are arbitrary integers and the frequency setting interval FD is above the frequency setting interval FD2 of the second frequency converter and is indivisible by it, the frequency deviation of the output signal from the digital up-converter will exceed an allowable range. For this reason, first, the first frequency converter frequency-converts the input signal using a frequency signal output from the NCO of the first aspect as the first local oscillator and set to the frequency setting interval of the FD1 step, where $FD1=(FD \bmod FD2)/K1$. Then, the second frequency converter secondarily frequency-converts the output signal from the first frequency converter using a frequency signal output from the NCO of the first aspect as the second local oscillator and set to the frequency setting interval of the FD2 step, where $FD2=FD/K2 \times L2$. Therefore, the digital up-converter can set the frequency setting interval of its output signal to FD.

In accordance with an eighth aspect of the present invention, there is provided a digital up-converter comprising a first frequency converter including the NCO of the first aspect as a first local oscillator and serving to frequency-convert an input signal, and a second frequency converter including the NCO of the first aspect as a second local oscillator and serving to secondarily frequency-convert an output signal from the first frequency converter, the digital up-converter performing two frequency conversions to convert the input signal into a signal with a frequency higher than that of the input signal and output the converted signal as an output signal sampled at a sampling frequency Fs2, wherein: if a desired frequency setting interval of the output signal is FD and K1, K2 and L2 are arbitrary integers, the second frequency converter is adapted to frequency-convert the output signal from the first frequency converter using a first specific signal output from the second local oscillator and set to a frequency setting interval of an FD2 step, where $FD2=FD/K2 \times L2$, the second local oscillator outputting the first specific signal by accumulating the phase difference data by a modulo operation taking a nearest integer of M2 as a modulus, where $M2=Fs2/FD \times K2/L2$; and the first frequency converter is adapted to, if a sampling frequency of the input signal is Fs1, frequency-convert the input signal using a second specific signal output from the first local oscillator and set to a frequency setting interval of an FD1 step, where $FD1=(FD2 \bmod FD)/K1$, the first local oscillator outputting the second specific signal by accumulating the phase difference data by a modulo operation taking a nearest integer of M1 as a modulus, where $M1=Fs1/(FD \bmod FD2) \times K1$.

The digital up-converter with the above-described configuration performs two frequency conversions to convert the input signal into a signal with a frequency higher than that of the input signal and output the converted signal as an output signal sampled at the sampling frequency Fs2. If the desired frequency setting interval of the output signal is FD, K1, K2 and L2 are arbitrary integers and the frequency setting interval FD is below the frequency setting interval FD2 of the second frequency converter and FD2 is indivisible by FD, the frequency deviation of the output signal from the digital up-converter will exceed an allowable range. For this reason, first, the first frequency converter frequency-converts the input signal using a frequency signal output from the NCO of the first aspect as the first local oscillator and set to the frequency setting interval of the FD1 step, where $FD1=(FD2 \bmod FD)/K1$. Then, the second frequency converter secondarily frequency-converts the output signal from the first frequency converter using a frequency signal output from the NCO of the first aspect as the second local oscillator and set to the frequency setting interval of the FD2 step, where $FD2=FD/K2 \times L2$. Therefore, the digital up-converter can set the frequency setting interval of its output signal to FD.

In accordance with a ninth aspect of the present invention, there is provided a digital up-converter comprising a first frequency converter including the NCO of the first aspect as a first local oscillator and serving to frequency-convert an input signal, and a second frequency converter including the NCO of the first aspect as a second local oscillator and serving to secondarily frequency-convert an output signal from the first frequency converter, the digital up-converter performing two frequency conversions to convert the input signal into a signal with a frequency higher than that of the input signal and output the converted signal as an output signal sampled at a sampling frequency Fs2, wherein: if a desired frequency setting interval of the output signal is FD and K1, K2 and L2 are arbitrary integers, the second frequency converter is adapted to frequency-convert the output signal from the first frequency converter using a first specific signal output from the second local oscillator and set to a frequency setting interval of an FD2 step, where $FD2=FD/K2 \times L2$, the second local oscillator outputting the first specific signal by accumulating the phase difference data by a modulo operation taking a nearest integer of M2 as a modulus, where $M2=Fs2/FD \times K2/L2$; and the first frequency converter is adapted to, if a sampling frequency of the input signal is Fs1, frequency-convert the input signal using a second specific signal output from the first local oscillator and set to a frequency setting interval of an FD1 step, where $FD1=FD/K1$, the first local oscillator outputting the second specific signal by accumulating the phase difference data by a modulo operation taking a nearest integer of M1 as a modulus, where $M1=Fs1/FD \times K1$.

The digital up-converter with the above-described configuration performs two frequency conversions to convert the input signal into a signal with a frequency higher than that of the input signal and output the converted signal as an output signal sampled at the sampling frequency Fs2. If the desired frequency setting interval of the output signal is FD, K1, K2 and L2 are arbitrary integers, and the frequency setting interval FD is higher than or equal to the frequency setting interval FD2 of the second frequency converter and is evenly divisible by it, or FD is lower than FD2 and FD2 is evenly divisible by FD, first, the first frequency converter frequency-converts the input signal using a frequency signal output from the NCO of the first aspect as the first local oscillator and set to the frequency setting interval of the FD1 step, where $FD1=FD/K1$. Then, the second frequency converter secondarily frequency-converts the output signal from the first frequency converter using a frequency signal output from the NCO of the first aspect as the second local oscillator and set to the frequency setting interval of the FD2 step, where FD2=FD/K2×L2. Therefore, the digital up-converter can set the frequency setting interval of its output signal to FD.

Preferably, in the digital up-converter of the seventh, eighth, or ninth aspect, the first frequency converter may stop its frequency conversion.

In the case where a multiple of the frequency setting interval FD2 of the second frequency converter is equal to that of the frequency setting interval FD of the output signal, the digital up-converter with the above-described configuration can set the frequency setting interval of its output signal to FD by means of only the second frequency converter.

In accordance with a tenth aspect of the present invention, there is provided a receiver comprising a first frequency converter including a first local oscillator and serving to frequency-convert a received signal, the first local oscillator including the NCO of the first aspect operating at the sampling frequency Fs and a phase locked loop (PLL) circuit having a multiplication ratio P (P is an integer) and acting to receive the output signal from the NCO of the first aspect as a reference signal, a second frequency converter including the NCO of the first aspect as a second local oscillator and serving to secondarily frequency-convert an output signal from the first frequency converter, and a demodulator for demodulating an output signal from the second frequency converter to extract received data therefrom, the receiver converting the received signal into a baseband received signal with a frequency lower than that of the received signal by two frequency conversions and extracting the received data from the converted baseband received signal, wherein: if a desired frequency setting interval of the received signal is FD and K1, K2 and L1 are arbitrary integers, the first frequency converter is adapted to frequency-convert the received signal using a first specific signal output from the first local oscillator and set to a frequency setting interval of an FDP step, where FDP=FD/K1×L1, the first local oscillator outputting the first specific signal by accumulating the phase difference data by a modulo operation taking a nearest integer of M1 as a modulus, where M1=Fs/FD×K1/L1×P; and the second frequency converter is adapted to, if a sampling frequency of the output signal from the first frequency converter is Fs1, frequency-convert the output signal from the first frequency converter using a second specific signal output from the second local oscillator and set to a frequency setting interval of an FD2 step, where FD2=(FD mod FDP)/K2, the second local oscillator outputting the second specific signal by accumulating the phase difference data by a modulo operation taking a nearest integer of M2 as a modulus, where M2=Fs1/(FD mod FDP)×K2.

The receiver with the above-described configuration converts the received signal into a baseband received signal with a frequency lower than that of the received signal by two frequency conversions. If the desired frequency setting interval of the received signal is FD, K1, K2 and L1 are arbitrary integers and the frequency setting interval FD is above the frequency setting interval FDP of the first frequency converter and is indivisible by it, the deviation of the frequency desired by the demodulator will exceed an allowable range. For this reason, first, the first frequency converter frequency-converts the received signal using a frequency signal output from the first local oscillator including the PLL circuit with the multiplication ratio P and the NCO of the first aspect and set to the frequency setting interval of the FD1 step, where FD1=FDP/P=FD/K1×L1/P. Then, the second frequency converter secondarily frequency-converts the output signal from the first frequency converter using a frequency signal output from the NCO of the first aspect as the second local oscillator and set to the frequency setting interval of the FD2 step, where FD2=(FD mod FDP)/K2. Therefore, the receiver can accurately convert the frequency of the received signal input thereto at the frequency setting interval FD into that desired by the demodulator.

In accordance with an eleventh aspect of the present invention, there is provided a receiver comprising a first frequency converter including a first local oscillator and serving to frequency-convert a received signal, the first local oscillator including the NCO of the first aspect operating at the sampling frequency Fs and a PLL circuit (having a multiplication ratio P (P is an integer) and acting to receive the output signal from the NCO of the first aspect as a reference signal, a second frequency converter (for example, the frequency converter 12 of the sixth embodiment or the frequency converter 85 of the seventh embodiment) including the NCO of the first aspect as a second local oscillator and serving to secondarily frequency-convert an output signal from the first frequency converter, and a demodulator for demodulating an output signal from the second frequency converter to extract received data therefrom, the receiver converting the received signal into a baseband received signal with a frequency lower than that of the received signal by two frequency conversions and extracting the received data from the converted baseband received signal, wherein: if a desired frequency setting interval of the received signal is FD and K1, K2 and L1 are arbitrary integers, the first frequency converter is adapted to frequency-convert the received signal using a first specific signal output from the first local oscillator and set to a frequency setting interval of an FDP step, where FDP=FD/K1×L1, the first local oscillator outputting the first specific signal by accumulating the phase difference data by a modulo operation taking a nearest integer of M1 as a modulus, where M1=Fs/FD×K1/L1×P; and the second frequency converter is adapted to, if a sampling frequency of the output signal from the first frequency converter is Fs1, frequency-convert the output signal from the first frequency converter using a second specific signal output from the second local oscillator and set to a frequency setting interval of an FD2 step, where FD2=(FDP mod FD)/K2, the second local oscillator outputting the second specific signal by accumulating the phase difference data by a modulo operation taking a nearest integer of M2 as a modulus, where M2=Fs1/(FDP mod FD)×K2.

The receiver with the above-described configuration converts the received signal into a baseband received signal with a frequency lower than that of the received signal by two frequency conversions. If the desired frequency setting interval of the received signal is FD, K1, K2, and L1 are arbitrary integers and the frequency setting interval FD is below the frequency setting interval FDP of the first frequency converter and FDP is indivisible by FD, the deviation of the frequency desired by the demodulator will exceed an allowable range. For this reason, first, the first frequency converter frequency-converts the received signal using a frequency signal output from the first local oscillator including the PLL circuit with the multiplication ratio P and the NCO of the first aspect and set to the frequency setting interval of the FD1 step, where FD1=FDP/P=FD/K1×L1/P. Then, the second frequency converter secondarily frequency-converts the output signal from the first frequency converter using a frequency signal output from the NCO of the first aspect as the second local oscillator and set to the frequency setting interval of the FD2 step, where FD2=(FDP mod FD)/K2. Therefore, the receiver can accurately convert the frequency of the received signal input thereto at the frequency setting interval FD into that desired by the demodulator.

In accordance with a twelfth aspect of the present invention, there is provided a receiver comprising a first frequency converter including a first local oscillator and serving to frequency-convert a received signal, the first local oscillator including the NCO of the first aspect operating at the sampling frequency Fs and a PLL circuit (having a multiplication ratio P (P is an integer) and acting to receive the output signal from the NCO of the first aspect as a reference signal, a second frequency converter including the NCO of the first aspect as a second local oscillator and serving to secondarily frequency-convert an output signal from the first frequency converter, and a demodulator for demodulating an output signal from the second frequency converter to extract received data therefrom, the receiver converting the received signal into a baseband received signal with a frequency lower than that of the received signal by two frequency conversions and extracting the received data from the converted baseband received signal, wherein: if a desired frequency setting interval of the received signal is FD and K1, K2 and L1 are arbitrary integers, the first frequency converter is adapted to frequency-convert the received signal using a first specific signal output from the first local oscillator and set to a frequency setting interval of an FDP step, where FDP=FD/K1×L1, the first local oscillator outputting the first specific signal by accumulating the phase difference data by a modulo operation taking a nearest integer of M1 as a modulus, where M1=Fs/FD×K1/L1×P; and the second frequency converter is adapted to, if a sampling frequency of the output signal from the first frequency converter is Fs1, frequency-convert the output signal from the first frequency converter using a second specific signal output from the second local oscillator and set to a frequency setting interval of an FD2 step, where FD2=FD/K2, the second local oscillator outputting the second specific signal by accumulating the phase difference data by a modulo operation taking a nearest integer of M2 as a modulus, where M2=Fs1/FD×K2.

The receiver with the above-described configuration converts the received signal into a baseband received signal with a frequency lower than that of the received signal by two frequency conversions. If the desired frequency setting interval of the received signal is FD, K1, K2 and L1 are arbitrary integers, and the frequency setting interval FD is higher than or equal to the frequency setting interval FDP of the first frequency converter and is evenly divisible by it, or FD is lower than FDP and FDP is evenly divisible by FD, first, the first frequency converter frequency-converts the received signal using a frequency signal output from the first local oscillator including the PLL circuit with the multiplication ratio P and the NCO of the first aspect and set to the frequency setting interval of the FD1 step, where FD1=FDP/P=FD/K1×L1/P. Then, the second frequency converter secondarily frequency-converts the output signal from the first frequency converter using a frequency signal output from the NCO of the first aspect as the second local oscillator and set to the frequency setting interval of the FD2 step, where FD2=FD/K2. Therefore, the receiver can accurately convert the frequency of the received signal input thereto at the frequency setting interval FD into that desired by the demodulator.

Preferably, in the receiver of the tenth, eleventh, or twelfth aspect, the second frequency converter may stop its frequency conversion.

In the case where a multiple of the frequency setting interval FD1 of the first frequency converter is equal to that of the frequency setting interval FD of the received signal, the receiver with the above-described configuration can accurately convert the frequency of the received signal input thereto at the frequency setting interval FD into that desired by the demodulator by means of only the first frequency converter.

In accordance with a thirteenth aspect of the present invention, there is provided a transmitter comprising a modulator for modulating and outputting a baseband transmit signal based on transmit data, a first frequency converter including the NCO of the first aspect as a first local oscillator and serving to frequency-convert the output signal from the modulator, a second frequency converter including a second local oscillator and serving to secondarily frequency-convert an output signal from the first frequency converter, the second local oscillator including the NCO of the first aspect operating at the sampling frequency Fs and a PLL circuit having a multiplication ratio P (P is an integer) and acting to receive the output signal from the NCO of the first aspect as a reference signal, the transmitter converting and outputting the baseband transmit signal into a transmit signal with a frequency higher than that of the baseband transmit signal by two frequency conversions, wherein: if a desired frequency setting interval of the transmit signal is FD and K1, K2 and L2 are arbitrary integers, the second frequency converter is adapted to frequency-convert the output signal from the first frequency converter using a first specific signal output from the second local oscillator and set to a frequency setting interval of an FDP step, where FDP=FD/K2×L2, the second local oscillator outputting the first specific signal by accumulating the phase difference data by a modulo operation taking a nearest integer of M2 as a modulus, where M2=Fs/FD×K2/L2×P; and the first frequency converter is adapted to, if a sampling frequency of the output signal from the modulator is Fs1, frequency-convert the output signal from the modulator using a second specific signal output from the first local oscillator and set to a frequency setting interval of an FD1 step, where FD1=(FD mod FDP)/K1, the first local oscillator outputting the second specific signal by accumulating the phase difference data by a modulo operation taking a nearest integer of M1 as a modulus, where M1=Fs1/(FD mod FDP)×K1.

The transmitter with the above-described configuration converts and outputs the baseband transmit signal into a transmit signal with a frequency higher than that of the baseband transmit signal by two frequency conversions.

If the desired frequency setting interval of the transmit signal is FD, K1, K2 and L2 are arbitrary integers and the frequency setting interval FD is above the frequency setting interval FDP of the second frequency converter and is indivisible by it, the frequency deviation of the transmit signal from the transmitter will exceed an allowable range. For this reason, first, the first frequency converter frequency-converts the baseband transmit signal using a frequency signal output from the NCO of the first aspect as the first local oscillator and set to the frequency setting interval of the FD1 step, where FD1=(FD mod FDP)/K1. Then, the second frequency converter secondarily frequency-converts the output signal from the first frequency converter using a frequency signal output from the second local oscillator including the PLL circuit with the multiplication ratio P and the NCO of the first aspect and set to the frequency setting interval of the FD2 step, where FD2=FDP/P=FD/K2×L2/P. Therefore, the transmitter can accurately convert the frequency of the baseband transmit signal from the modulator into a target transmit signal frequency.

In accordance with a fourteenth aspect of the present invention, there is provided a transmitter comprising a modulator for modulating and outputting a baseband transmit signal based on transmit data, a first frequency converter including the NCO of the first aspect as a first local oscillator and serving to frequency-convert the output signal from the modulator, a second frequency converter including a second local oscillator and serving to secondarily frequency-convert an output signal from the first frequency converter, the second local oscillator including the NCO of the first aspect operating at the sampling frequency Fs and a PLL circuit having a multiplication ratio P (P is an integer) and acting to receive the output signal from the NCO of the first aspect as a reference signal, the transmitter converting and outputting the baseband transmit signal into a transmit signal with a frequency higher than that of the baseband transmit signal by two frequency conversions, wherein: if a desired frequency setting interval of the transmit signal is FD and K1, K2 and L2 are arbitrary integers, the second frequency converter is adapted to frequency-convert the output signal from the first frequency converter using a first specific signal output from the second local oscillator and set to a frequency setting interval of an FDP step, where FDP=FD/K2×L2, the second local oscillator outputting the first specific signal by accumulating the phase difference data by a modulo operation taking a nearest integer of M2 as a modulus, where M2=Fs/FD×K2/L2×P; and the first frequency converter is adapted to, if a sampling frequency of the output signal from the modulator is Fs1, frequency-convert the output signal from the modulator using a second specific signal output from the first local oscillator and set to a frequency setting interval of an FD1 step, where FD1=(FDP mod FD)/K1, the first local oscillator outputting the second specific signal by accumulating the phase difference data by a modulo operation taking a nearest integer of M1 as a modulus, where M1=Fs1/(FDP mod FD)×K1.

The transmitter with the above-described configuration converts and outputs the baseband transmit signal into a transmit signal with a frequency higher than that of the baseband transmit signal by two frequency conversions.

If the desired frequency setting interval of the transmit signal is FD, K1, K2, and L2 are arbitrary integers and the frequency setting interval FD is below the frequency setting interval FD2 of the second frequency converter and FD2 is indivisible by FD, the frequency deviation of the transmit signal from the transmitter will exceed an allowable range. For this reason, first, the first frequency converter frequency-converts the baseband transmit signal using a frequency signal output from the NCO of the first aspect as the first local oscillator and set to the frequency setting interval of the FD1 step, where FD1=(FDP mod FD)/K1. Then, the second frequency converter secondarily frequency-converts the output signal from the first frequency converter using a frequency signal output from the second local oscillator including the PLL circuit with the multiplication ratio P and the NCO of the first aspect and set to the frequency setting interval of the FD2 step, where FD2=FDP/P=FD/K2×L2/P. Therefore, the transmitter can accurately convert the frequency of the baseband transmit signal from the modulator into a target transmit signal frequency.

In accordance with a fifteenth aspect of the present invention, there is provided a transmitter comprising a modulator for modulating and outputting a baseband transmit signal based on transmit data, a first frequency converter including the NCO of the first aspect as a first local and serving to frequency-convert the output signal from the modulator, a second frequency converter including a second local oscillator and serving to secondarily frequency-convert an output signal from the first frequency converter, the second local oscillator including the NCO of the first aspect operating at the sampling frequency Fs and a PLL circuit having a multiplication ratio P (P is an integer) and acting to receive the output signal from the NCO of the first aspect as a reference signal, the transmitter converting and outputting the baseband transmit signal into a transmit signal with a frequency higher than that of the baseband transmit signal by two frequency conversions, wherein: if a desired frequency setting interval of the transmit signal is FD and K1, K2 and L2 are arbitrary integers, the second frequency converter is adapted to frequency-convert the output signal from the first frequency converter using a first specific signal output from the second local oscillator and set to a frequency setting interval of an FDP step, where FDP=FD/K2×L2, the second local oscillator outputting the first specific signal by accumulating the phase difference data by a modulo operation taking a nearest integer of M2 as a modulus, where M2=Fs/FD×K2/L2×P; and the first frequency converter is adapted to, if a sampling frequency of the output signal from the modulator is Fs1, frequency-convert the output signal from the modulator using a second specific signal output from the first local oscillator and set to a frequency setting interval of an FD1 step, where FD1=FD/K1, the first local oscillator outputting the second specific signal by accumulating the phase difference data by a modulo operation taking a nearest integer of M1 as a modulus, where M1=Fs1/FD×K1.

The transmitter with the above-described configuration converts and outputs the baseband transmit signal into a transmit signal with a frequency higher than that of the baseband transmit signal by two frequency conversions.

If the desired frequency setting interval of the transmit signal is FD, K1, K2, and L2 are arbitrary integers, and the frequency setting interval FD is higher than or equal to the frequency setting interval FD2 of the second frequency converter and is evenly divisible by it, or FD is lower than FD2 and FD2 is evenly divisible by FD, the frequency deviation of the transmit signal from the transmitter will exceed an allowable range. For this reason, first, the first frequency converter frequency-converts the baseband transmit signal using a frequency signal output from the NCO of the first aspect as the first local oscillator and set to the frequency setting interval of the FD1 step, where FD1=FD/K1. Then, the second frequency converter secondarily frequency-converts the output signal from the first frequency converter using a frequency signal output from the second local oscillator including the PLL circuit with the multiplication ratio P and the NCO of the first aspect and set to the frequency setting interval of the FD2 step, where FD2=FDP/P=FD/K2×L2/P. Therefore, the transmitter can accurately convert the frequency of the baseband transmit signal from the modulator into a target transmit signal frequency.

Preferably, in the transmitter of the thirteenth, fourteenth, or fifteenth aspect, the first frequency converter may stop its frequency conversion.

In the case where a multiple of the frequency setting interval FD2 of the second frequency converter is equal to that of the frequency setting interval FD of the transmit signal, the transmitter with the above-described configuration can accurately convert the frequency of the baseband transmit signal from the modulator into that of a target transmit signal by means of only the second frequency converter.

BRIEF DESCRIPTION OF THE DRAWINGS

The above and other objects, features, and advantages of the present invention will be more clearly understood from the following detailed description taken in conjunction with the accompanying drawings, in which.

DETAILED DESCRIPTION OF THE PREFERRED EMBODIMENTS

Preferred embodiments of the present invention will be described in detail herein below with reference to the annexed drawings. In the following description, a detailed description of known functions and configurations incorporated herein will be omitted when it may make the subject matter of the present invention rather unclear.

Figure 1:
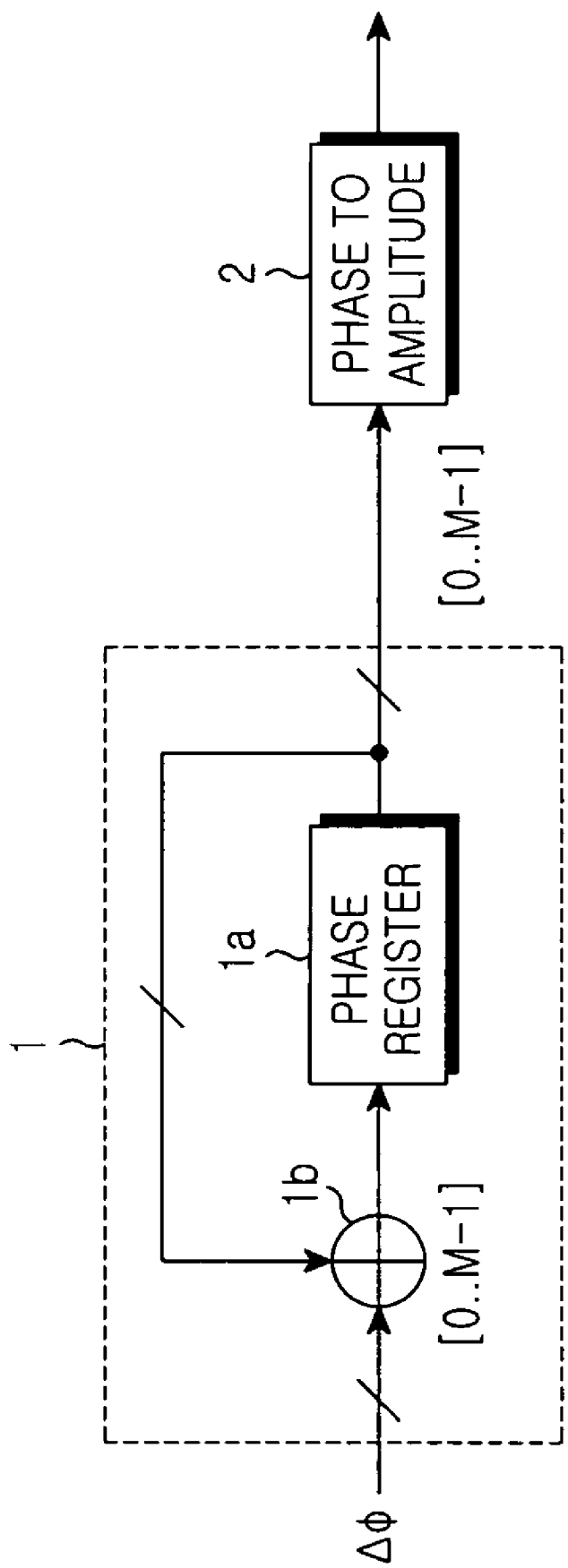
FIG. 1 is a block diagram illustrating the configuration of a numerical control oscillator according to a first embodiment of the present invention.

FIG. 1 is a block diagram illustrating the configuration of a numerical control oscillator (NCO) of the first embodiment. As illustrated in FIG. 1, the NCO comprises a phase accumulator 1 for accumulating input phase difference data to generate phase data, and a memory, preferably a read only memory (ROM), 2 for storing a phase/amplitude conversion table to output amplitude data corresponding to the phase data generated by the phase accumulator 1.

In detail, on the assumption that a sampling frequency of an output signal from the NCO is Fs, the upper limit of a desired frequency setting interval of the output signal is FD, and K and L are arbitrary integers, the phase accumulator 1 includes a phase register 1a for storing and outputting the phase data, and a phase calculator 1b for adding or subtracting the input phase difference data and the phase data from the phase register 1a to or from each other by a modulo operation taking the nearest integer of M as a modulus, where M=Fs/FD×K/L. Therefore, the phase accumulator 1 accumulates the phase difference data as an input signal to the NCO to generate the phase data.

The ROM 2 has its address terminal connected to an output terminal of the phase accumulator 1 by j-bit wiring, where $j=\log_2 M$ (where, j is rounded up to the nearest integer), and stores the phase/amplitude conversion table, which includes M amplitude data. Therefore, the ROM 2 outputs the amplitude data corresponding to the phase data, input from the phase accumulator 1 to the address terminal, through its data terminal as the output signal of the NCO. As a result, the NCO of the present embodiment provides its output signal set to a frequency setting interval of a dF step, where dF=FD/K×L.

For example, assuming that the sampling frequency Fs of the output signal from the NCO is 153.6 MHz, the upper limit FD of the desired frequency setting interval of the output signal is 200 KHz, and K and L are 1s, the phase calculator 1b adds or subtracts the input phase difference data and the phase data from the phase register 1a to or from each other by a modulo operation taking M="768" as a modulus, where M=Fs/FD×K/L=153.6[MHz]/200[KHz]=768.

Also, the address terminal of the ROM 2 is connected to the output terminal of the phase accumulator 1 by the j-bit wiring, where $j=\log_2 M=\log_2 768 \approx 9.58=10$ (where, j is rounded up to the nearest integer), namely, 10-bit wiring.

Therefore, the word length of the ROM 2 and the phase word length of the phase calculator 1b become equal, and as a result there is no need to requantize an address word length (the word length of the ROM 2) from the phase calculator 1b. Therefore, it is possible to realize a low-spurious NCO which has no error $e^p$ resulting from requantization and provides its output signal based on only low-capacity amplitude data of 768 words necessary for the modulo operation based on the modulus of "768" under the condition that the sampling frequency Fs of the output signal is 153.6 MHz and the frequency setting interval dF is FD/K×L=200 KHz.

Further, the NCO with the above-described configuration can have settings corresponding to respective communication systems (for example, a W-CDMA mobile phone system, an IS-95 mobile phone system and an IEEE 802.11a wireless LAN system), including the above-described exemplary values, as shown in the below table 1.

TABLE 1

| No. | FD[KHz] | Fs[MHz] | dF[KHz] | K | L | M |
|---|---|---|---|---|---|---|
| W-CDMA | | | | | | |
| 1 | 200 | 61.44 | 40 | 5 | 1 | 1536 |
| 2 | 200 | 61.44 | 80 | 5 | 2 | 768 |
| 3 | 200 | 92.16 | 40 | 5 | 1 | 2304 |
| 4 | 200 | 122.88 | 40 | 5 | 1 | 3072 |
| 5 | 200 | 153.6 | 200 | 1 | 1 | 768 |
| 6 | 200 | 153.6 | 1600 | 1 | 8 | 96 |
| 7 | 200 | 184.32 | 200 | 5 | 1 | 4608 |
| IS-95 Band Class 0 | | | | | | |
| 8 | 30 | 98.304 | 6 | 5 | 1 | 16384 |
| 9 | 30 | 98.304 | 12 | 5 | 2 | 8192 |
| IEEE 802.11a | | | | | | |
| 10 | 20000 | 100 | 20000 | 1 | 1 | 5 |
| 11 | 20000 | 200 | 20000 | 1 | 1 | 10 |

As one example of the above table 1, assuming that the sampling frequency Fs of the output signal from the NCO is 61.44 MHz, the upper limit FD of the desired frequency setting interval of the output signal is 200 KHz, K is 5, and L is 1, the output signal is provided based on only low-capacity amplitude data of 1536 words necessary for a modulo operation taking M="1536" as a modulus by the phase calculator 1b, where M=Fs/FD×K/L=61.44[MHz]/200[KHz]×5=1536. That is, it is possible to realize a low-spurious NCO which provides its output signal based on only low-capacity amplitude data under the condition that the sampling frequency Fs of the output signal is 61.44 MHz and the frequency setting interval dF is FD/K×L=200[KHz]/5=40[KHz].

Figure 2:
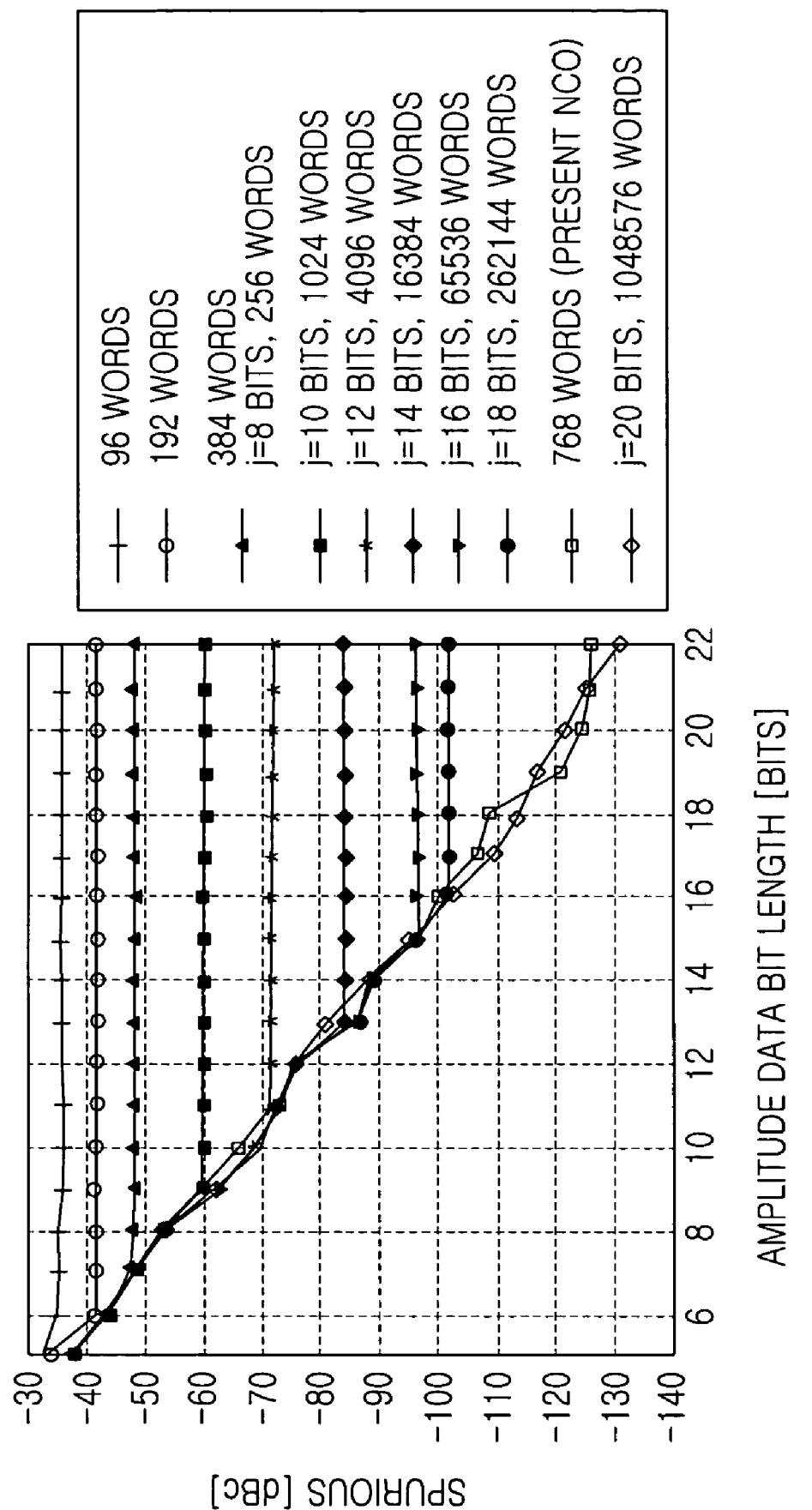
FIG. 2 is a graph illustrating a comparison of simulation results of spurious characteristics between a conventional numerical control oscillator and the numerical control oscillator of the first embodiment.

FIG. 2 is a graph illustrating a comparison of simulation results of spurious characteristics between a conventional NCO that performs a modulo operation taking $2^j$ as a modulus (a parameter is represented by a phase word length j and the number of amplitude data in the phase/amplitude conversion table) and the NCO of the first embodiment (a parameter is represented by only the number of amplitude data in the phase/amplitude conversion table) under the above-described condition, wherein the axis of abscissa represents an amplitude data bit length output from the ROM 2, the axis of ordinate represents a spurious, and the number of amplitude data in the phase/amplitude conversion table stored in the ROM 2 represents a parameter. As illustrated in FIG. 2, in the case where the NCO of the present embodiment makes the word length of the ROM 2 shorter to use amplitude data of, for example, 384 words, 192 words or 96 words, the spurious characteristics thereof are severely worsened. However, as long as the NCO generates phase data by adding or subtracting the input phase difference data and the phase data from the phase register 1a to or from each other by a modulo operation taking the nearest integer of M as a modulus, where M=Fs/FD×K/L, namely, M=768 under the above condition, it can obtain the same spurious characteristics as those of a conventional NCO that performs a modulo operation taking $2^{20}$ as a modulus and requires amplitude data of about 1M words.

Next, a description will be given of examples of applications of the NCO of the first embodiment with reference to the accompanying drawings. For example, the NCO of the first embodiment may be used in a digital down-converter as shown in FIG. 3.

Figure 3:
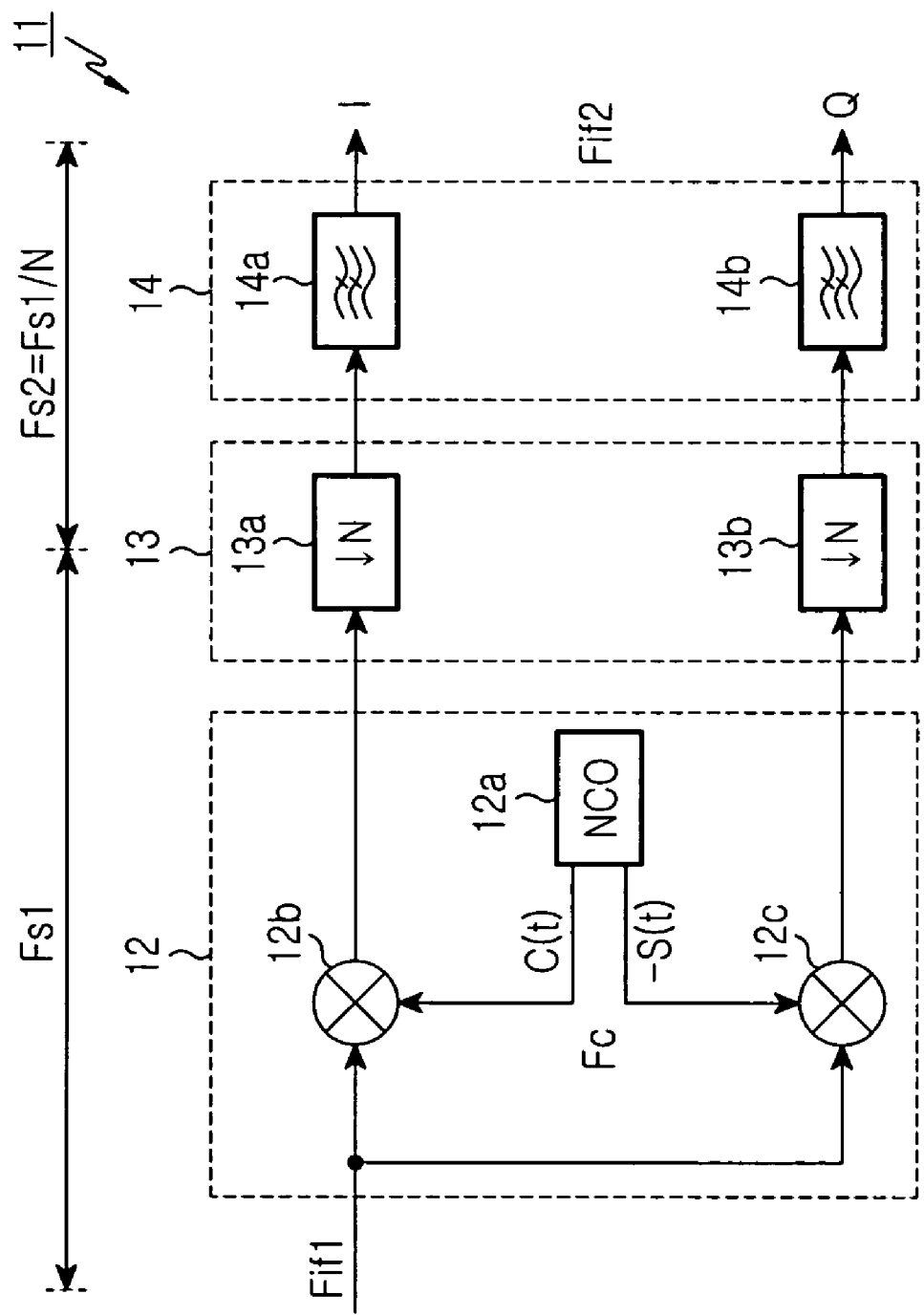
FIG. 3 is a block diagram illustrating the configuration of an embodiment of a digital down-converter using the numerical control oscillator of the first embodiment.

FIG. 3 is a block diagram illustrating the configuration of an embodiment of a digital down-converter 11 using the NCO of the first embodiment. As illustrated in FIG. 3, the digital down-converter 11 comprises a frequency converter 12 for frequency-converting an input signal of a center frequency Fif1 to obtain a complex signal (zero IF signal) of a center frequency Fif2=0[Hz]. The frequency converter 12 includes a local oscillator 12a using the NCO of the first embodiment, for generating a complex local signal of a frequency Fc (containing a real component "C(t)=cos(2π×Fc×t)" and an imaginary component "−S(t)=−sin(2π×Fc×t)" whose phase is 90 degrees ahead of that of the real component), and multipliers 12b and 12c for multiplying the input signal by the real and imaginary components of the complex local signal generated by the local oscillator 12a, respectively.

A decimator 13 decimates the complex signal from the frequency converter 12. To this end, the decimator 13 includes real and imaginary decimators 13a and 13b each for multiplying a sampling frequency Fs1 of a corresponding one of real and imaginary components of the complex signal by 1/N to convert it into a sampling frequency Fs2=Fs1/N. A roll-off filter 14 band-limits the complex signal decimated by the decimator 13 to a target signal band to output the resulting complex signal (I,Q). To this end, the roll-off filter 14 includes a real filter 14a and an imaginary filter 14b.

For example, assuming that a desired frequency setting interval FD of an input signal is evenly divisible by a frequency setting interval dF of the frequency converter 12, the digital down-converter 11 is operated in the following manner. In this case, if K and L are arbitrary integers, the frequency converter 12 sets phase difference data φ to the local oscillator 12a using the NCO of the first embodiment to a value of φ=Fc/dF=Fc/FD×K/L. Then, the frequency converter 12 accurately converts an input signal of a center frequency Fif1 into a complex signal of a center frequency Fif2 using a complex local signal of a frequency Fc output from the local oscillator 12a and set to a frequency setting interval of a dF step, where dF=FD/K×L. Here, the local oscillator 12a outputs the complex local signal of the frequency Fc by accumulating the phase difference data by a modulo operation taking the nearest integer of M as a modulus, where M=Fs1/FD×K/L.

More specifically, assuming that a sampling frequency Fs1 of an input signal is 153.6 MHz, a desired frequency setting interval FD of the input signal is 200 KHz, a center frequency Fif1 of the input signal is 36.4 MHz and K=L=1, the frequency converter 12 sets phase difference data φ to the local oscillator 12a using the NCO of the first embodiment to φ=Fc/dF=Fc/FD×K/L=36.4[MHz]/200[KHz]=182. Then, the frequency converter 12 accurately converts the input signal of the center frequency Fif1 into a complex signal (zero IF signal) of a center frequency Fif2=0[Hz] using a complex local signal of a frequency Fc=36.4[MHz] output from the local oscillator 12a and set to a frequency setting interval of a dF step, where dF=FD/K×L=200[KHz]. Here, the local oscillator 12a outputs the complex local signal of the frequency Fc by accumulating the phase difference data by a modulo operation taking M=768 as a modulus, where M=Fs1/FD×K/L=153.6[MHz]/200[KHz]=768.

Figure 4:
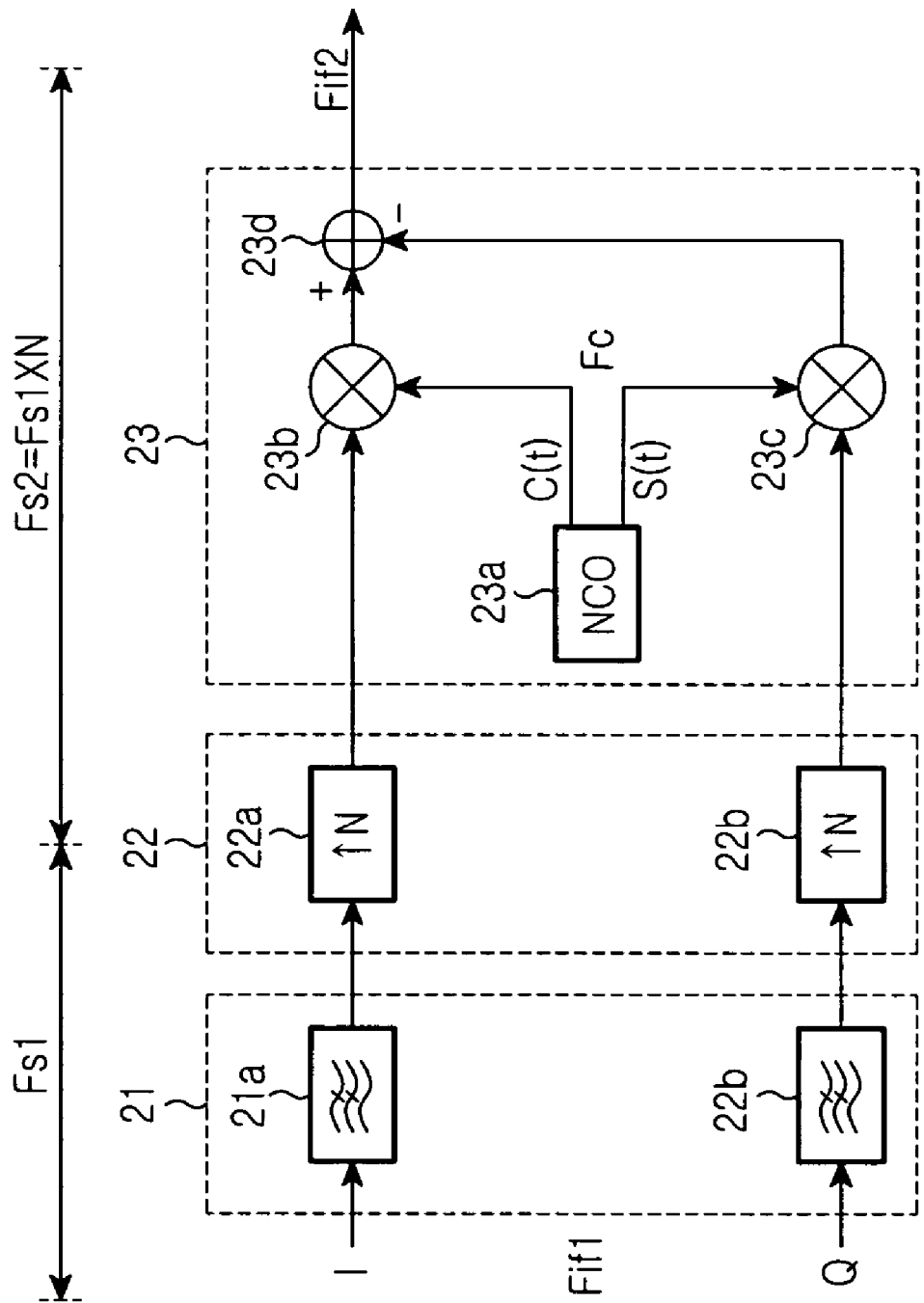
FIG. 4 is a block diagram illustrating the configuration of an embodiment of a digital up-converter using the numerical control oscillator of the first embodiment.

The NCO of the first embodiment may also be used in a digital up-converter as illustrated in FIG. 4.

FIG. 4 is a block diagram illustrating the configuration of an embodiment of a digital up-converter using the NCO of the first embodiment. As illustrated in FIG. 4, the digital up-converter comprises a roll-off filter 21 for band-limiting an input complex signal (containing baseband signal components I and Q) of a center frequency Fif1=0[Hz] to a target signal band. The roll-off filter 21 includes a real filter 21a and an imaginary filter 21b. An interpolator 22 interpolates the complex signal band-limited by the roll-off filter 21. To this end, the interpolator 22 includes real and imaginary interpolators 22a and 22b each for multiplying a sampling frequency Fs1 of a corresponding one of real and imaginary components of the complex signal by N to convert it into a sampling frequency Fs2=Fs1×N.

A frequency converter 23 frequency-converts an output signal from the interpolator 22 to output a real signal of a target center frequency Fif2. To this end, the frequency converter 23 includes a local oscillator 23a using the NCO of the first embodiment, for generating a complex local signal of a frequency Fc (containing a real component "C(t)=cos(2π×Fc×t)" and an imaginary component "S(t)=sin(2π×Fc×t)" whose phase is 90 degrees delayed from that of the real component), multipliers 23b and 23c for multiplying real and imaginary components of the output signal from the interpolator 22 by the real and imaginary components of the complex local signal generated by the local oscillator 23a, respectively, and a subtracter 23d for subtracting output signals from the multipliers 23b and 23c from each other.

For example, assuming that a desired frequency setting interval FD of an output signal is evenly divisible by a frequency setting interval dF of the frequency converter 23, the digital up-converter is operated in the following manner. In this case, if K and L are arbitrary integers, the frequency converter 23 sets phase difference data φ to the local oscillator 23a using the NCO of the first embodiment to a value of φ=Fc/dF=Fc/FD×K/L. Then, the frequency converter 23 accurately converts a baseband signal of a center frequency Fif1 into a complex signal of a target center frequency Fif2 using a complex local signal of a frequency Fc output from the local oscillator 23a and set to a frequency setting interval of a dF step, where dF=FD/K×L. Here, the local oscillator 23a outputs the complex local signal of the frequency Fc by accumulating the phase difference data by a modulo operation taking the nearest integer of M as a modulus, where M=Fs2/FD×K/L.

In detail, assuming that a sampling frequency Fs2 of an output signal is 153.6 MHz, a desired frequency setting interval FD of the output signal is 200 KHz, a center frequency Fif2 of the output signal is 72.8 MHz and K=L=1, the frequency converter 23 sets phase difference data φ to the local oscillator 23a using the NCO of the first embodiment to φ=Fc/dF=Fc/FD×K/L=72.8[MHz]/200[KHz]=364. Then, the frequency converter 23 accurately converts a baseband signal of a center frequency Fif1=0[Hz] into a complex signal of a target center frequency Fif2 using a complex local signal of a frequency Fc=72.8[MHz] output from the local oscillator 23a and set to a frequency setting interval of a dF step, where dF=FD/K×L=200[KHz]. Here, the local oscillator 23a outputs the complex local signal of the frequency Fc by accumulating the phase difference data by a modulo operation taking M=768 as a modulus, where M=Fs2/FD×K/L=153.6[MHz]/200[KHz]=768.

Next, a description will be given of the configuration of an alternative embodiment of the digital down-converter using the NCO of the first embodiment, which comprises first and second frequency converters each including the NCO as a local oscillator and serves to convert and output an input signal into a signal with a frequency lower than that of the input signal by two frequency conversions.

Figure 5:
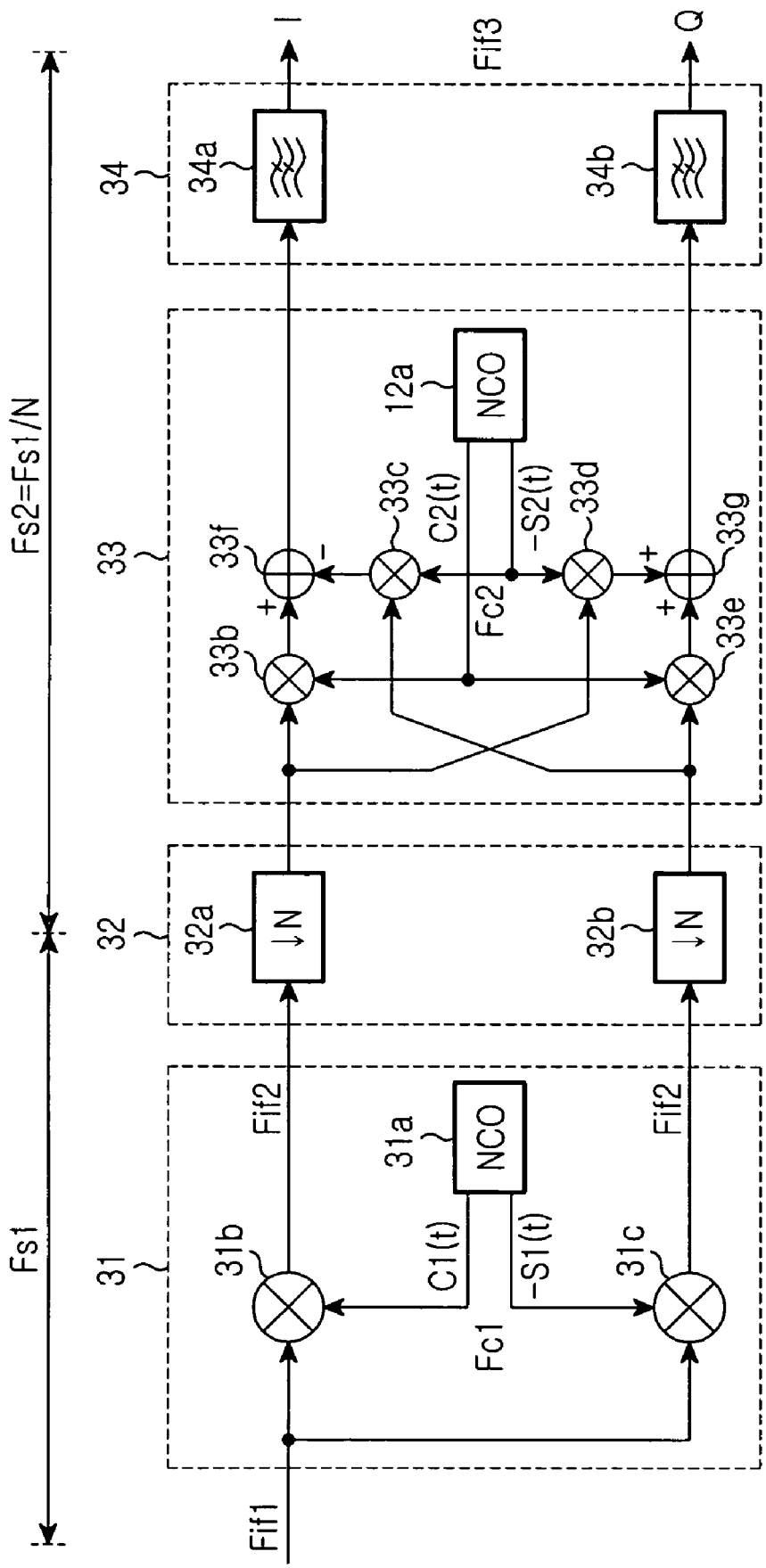
FIG. 5 is a block diagram illustrating the configuration of an alternative embodiment of the digital down-converter using the numerical control oscillator of the first embodiment.

FIG. 5 is a block diagram illustrating the configuration of the alternative embodiment of the digital down-converter using the numerical control oscillator of the first embodiment. As illustrated in FIG. 5, the digital down-converter comprises a frequency converter 31 for frequency-converting an input signal of a center frequency Fif1 to obtain a complex signal of a center frequency Fif2. The frequency converter 31 includes a local oscillator 31a using the NCO of the first embodiment, for generating a complex local signal of a frequency Fc1 (containing a real component "C1(t)=cos(2π×Fc1×t)" and an imaginary component "−S1(t)=−sin(2π×Fc1×t)" whose phase is 90 degrees ahead of that of the real component), and multipliers 31b and 31c for multiplying the input signal by the real and imaginary components of the complex local signal generated by the local oscillator 31a, respectively.

A decimator 32 decimates the complex signal from the frequency converter 31. To this end, the decimator 32 includes real and imaginary decimators 32a and 32b each for multiplying a sampling frequency Fs1 of a corresponding one of real and imaginary components of the complex signal by 1/N to convert it into a sampling frequency Fs2=Fs1/N. A frequency converter 33 frequency-converts the complex signal decimated by the decimator 32 to obtain a complex signal of a center frequency Fif3. The frequency converter 33 includes a local oscillator 33a using the NCO of the first embodiment, for generating a complex local signal of a frequency Fc2 (containing a real component "C2(t)=cos(2π×Fc2×t)" and an imaginary component "−S2(t)=−sin(2π×Fc2×t)" whose phase is 90 degrees ahead of that of the real component), and multipliers 33b, 33c, 33d, and 33e, a subtracter 33f and an adder 33g for performing multiplication, subtraction and addition operations with respect to the complex signal decimated by the decimator 32 and the complex local signal generated by the local oscillator 33a, respectively.

A roll-off filter 34 band-limits the complex signal from the frequency converter 33 to a target signal band to output the resulting complex signal (I,Q) of the center frequency Fif3. The roll-off filter 34 includes a real filter 34a and an imaginary filter 34b.

For example, assuming that a sampling frequency of an input signal is Fs1, and a desired frequency setting interval FD of the input signal is above a frequency setting interval FD1 of the frequency converter 31 and is indivisible by it, the digital down-converter is operated in the following manner. In this case, if K1, K2, and L1 are arbitrary integers, the frequency converter 31 sets phase difference data φ1 to the local oscillator 31a using the NCO of the first embodiment to a value of φ1=Fc1/FD1=Fc1/FD×K1/L1. Then, the frequency converter 31 converts an input signal of a center frequency Fif1 into a complex signal of a center frequency Fif2 using a complex local signal of a frequency Fc1 output from the local oscillator 31a and set to a frequency setting interval of an FD1 step, where FD1=FD/K1×L1. Here, the local oscillator 31a outputs the complex local signal of the frequency Fc1 by accumulating the phase difference data by a modulo operation taking the nearest integer of M1 as a modulus, where M1=Fs1/FD×K1/L1.

Also, the frequency converter 33 sets phase difference data φ2 to the local oscillator 33a using the NCO of the first embodiment to a value of φ2=Fc2/FD2=Fc2/(FD mod FD1)×K2. Then, the frequency converter 33 converts the complex signal of the center frequency Fif2 into a complex signal of a center frequency Fif3 using a complex local signal of a frequency Fc2 output from the local oscillator 33a and set to a frequency setting interval of an FD2 step, where FD2=(FD mod FD1)/K2. Here, the local oscillator 33a outputs the complex local signal of the frequency Fc2 by accumulating the phase difference data by a modulo operation taking the nearest integer of M2 as a modulus, where M2=Fs2/(FD mod FD1)×K2.

More specifically, assuming that a sampling frequency Fs1 of an input signal is 98.304 MHz, a desired frequency setting interval FD of the input signal is 30 KHz, a center frequency Fif1 of the input signal is 13.742 MHz, K1=15 and L1=8, the frequency converter 31 sets phase difference data φ1 to the local oscillator 31a using the NCO of the first embodiment to φ1=Fc1/FD1=Fc1/FD×K1/L1=13.728[MHz]/30[KHz]×15/8=858. The frequency converter 31 accurately converts the input signal of the center frequency Fif1 into a complex signal of a center frequency Fif2=14[Hz] using a complex local signal of a frequency Fc1=13.728[MHz] output from the local oscillator 31a and set to a frequency setting interval of an FD1 step, where FD1=FD/K1×L1=30[KHz]/15×8=16[KHz]. Here, the local oscillator 31a outputs the complex local signal of the frequency Fc1 by accumulating the phase difference data by a modulo operation taking M1=6144 as a modulus, where M1=Fs1/FD×K1/L1=98.304[MHz]/30[KHz]×15/8=6144.

Also, assuming that a decimation rate N of the decimator 32 is 10 and K2=7, the frequency converter 33 sets phase difference data φ2 to the local oscillator 33a using the NCO of the first embodiment to $\phi 2 = Fc2/FD2 = Fc2/(FD \bmod FD1) \times K2 = 14[KHz]/(30[KHz] \bmod 16[KHz]) \times 7 = 7$. Then, the frequency converter 33 accurately converts the complex signal of the center frequency Fif2 into a complex signal (zero IF signal) of a center frequency Fif3=0[Hz] using a complex local signal of a frequency Fc2 output from the local oscillator 33a and set to a frequency setting interval of an FD2 step, where $FD2 = (FD \bmod FD1)/K2 = (30[KHz] \bmod 16[KHz])/7 = 2[KHz]$. Here, the local oscillator 33a outputs the complex local signal of the frequency Fc2 by accumulating the phase difference data by a modulo operation taking the nearest integer of M2, 4915, as a modulus, where $M2 = Fs2/(FD \bmod FD1) \times K2 = 9.8304[MHz]/(30[KHz] \bmod 16[KHz]) \times 7$.

However, for example, assuming that a desired frequency setting interval FD of an input signal is below a frequency setting interval FD1 of the frequency converter 31 and FD1 is indivisible by FD, the frequency converter 31 sets phase difference data $\phi 1$ to the local oscillator 31a using the NCO of the first embodiment to a value of $\phi 1 = Fc1/FD1 = Fc1/FD \times K1/L1$. Then, the frequency converter 31 converts an input signal of a center frequency Fif1 into a complex signal of a center frequency Fif2 using a complex local signal of a frequency Fc1 output from the local oscillator 31a and set to a frequency setting interval of an FD1 step, where $FD1 = FD/K1 \times L1$. Here, the local oscillator 31a outputs the complex local signal of the frequency Fc1 by accumulating the phase difference data by a modulo operation taking the nearest integer of M1 as a modulus, where $M1 = Fs1/FD \times K1/L1$.

Also, the frequency converter 33 sets phase difference data $\phi 2$ to the local oscillator 33a using the NCO of the first embodiment to a value of $\phi 2 = Fc2/FD2 = Fc2/(FD1 \bmod FD) \times K2$. Then, the frequency converter 33 converts the complex signal of the center frequency Fif2 into a complex signal of a center frequency Fif3 using a complex local signal of a frequency Fc2 output from the local oscillator 33a and set to a frequency setting interval of an FD2 step, where $FD2 = (FD1 \bmod FD)/K2$. Here, the local oscillator 33a outputs the complex local signal of the frequency Fc2 by accumulating the phase difference data by a modulo operation taking the nearest integer of M2 as a modulus, where $M2 = Fs2/(FD1 \bmod FD) \times K2$.

Conversely, for example, assuming that a desired frequency setting interval FD of an input signal is higher than or equal to a frequency setting interval FD1 of the frequency converter 31 and is evenly divisible by it, or that FD is lower than FD1 and FD1 is evenly divisible by FD, the frequency converter 31 sets phase difference data $\phi 1$ to the local oscillator 31a using the NCO of the first embodiment to a value of $\phi 1 = Fc1/FD1 = Fc1/FD \times K1/L1$. Then, the frequency converter 31 converts an input signal of a center frequency Fif1 into a complex signal of a center frequency Fif2 using a complex local signal of a frequency Fc1 output from the local oscillator 31a and set to a frequency setting interval of an FD1 step, where $FD1 = FD/K1 \times L1$. Here, the local oscillator 31a outputs the complex local signal of the frequency Fc1 by accumulating the phase difference data by a modulo operation taking the nearest integer of M1 as a modulus, where $M1 = Fs1/FD \times K1/L1$.

Also, the frequency converter 33 sets phase difference data $\phi 2$ to the local oscillator 33a using the NCO of the first embodiment to a value of $\phi 2 = Fc2/FD2 = Fc2/FD \times K2$. Then, the frequency converter 33 converts the complex signal of the center frequency Fif2 into a complex signal of a center frequency Fif3 using a complex local signal of a frequency Fc2 output from the local oscillator 33a and set to a frequency setting interval of an FD2 step, where $FD2 = FD/K2$. Here, the local oscillator 33a outputs the complex local signal of the frequency Fc2 by accumulating the phase difference data by a modulo operation taking the nearest integer of M2 as a modulus, where $M2 = Fs2/FD \times K2$.

However, in the case where a multiple of the frequency setting interval FD1 of the frequency converter 31 is equal to that of the frequency setting interval FD of the input signal, the digital down-converter with the above-described configuration can convert the frequency of the input signal input thereto at the frequency setting interval FD into a desired frequency within the range of an allowable frequency deviation by means of only the frequency converter 31. In this case, the frequency conversion by the frequency converter 33 may be stopped.

Further, the digital down-converter with the above-stated configuration can have various settings of the respective parameters, including the above-described exemplary values, as shown in the below tables 2 to 5. The tables 2 and 3 show examples of settings of the respective parameters in a W-CDMA system, the table 4 shows examples of settings of the respective parameters in an IS-95 Band (Class 0) system, and the table 5 shows examples of settings of the respective parameters in an IEEE 802.11a system.

It should be noted that, in the tables, examples having no description of settings of the parameters associated with the frequency converter 33 are realizable by the digital down-converter configuration of FIG. 3 and those parameters are again readable as the corresponding parameters.

TABLE 2

| No. | Fifa [MHz] | Fif1 [MHz] | FD [KHz] | FD1 [KHz] | Fs1 [MHz] | Fc1 [MHz] | K1 | L1 | M1 | ΔØ1 |
|---|---|---|---|---|---|---|---|---|---|---|
| 1 | 190.00 | 5.680 | 200.0 | 40.0 | 61.440 | 5.680 | 5 | 1 | 1536 | 142 |
| 2 | 190.00 | 5.680 | 200.0 | 40.0 | 92.160 | 5.680 | 5 | 1 | 2304 | 142 |
| 3 | 190.00 | −55.760 | 200.0 | 40.0 | 122.880 | −55.760 | 5 | 1 | 3072 | −1394 |
| 4 | 189.60 | 36.000 | 200.0 | 200.0 | 153.600 | 36.000 | 1 | 1 | 768 | 180 |
| 5 | 189.80 | 36.200 | 200.0 | 200.0 | 153.600 | 36.200 | 1 | 1 | 768 | 181 |
| 6 | 190.00 | 36.400 | 200.0 | 200.0 | 153.600 | 36.400 | 1 | 1 | 768 | 182 |
| 7 | 190.15 | 36.550 | 200.0 | 200.0 | 153.600 | 36.400 | 1 | 1 | 768 | 182 |
| 8 | 190.20 | 36.600 | 200.0 | 200.0 | 153.600 | 36.600 | 1 | 1 | 768 | 183 |
| 9 | 190.35 | 36.750 | 200.0 | 200.0 | 153.600 | 36.600 | 1 | 1 | 768 | 183 |
| 10 | 190.40 | 36.800 | 200.0 | 200.0 | 153.600 | 36.800 | 1 | 1 | 768 | 184 |
| 11 | 189.80 | 36.200 | 200.0 | 1600.0 | 153.600 | 35.200 | 1 | 8 | 96 | 22 |
| 12 | 190.00 | 36.400 | 200.0 | 1600.0 | 153.600 | 35.200 | 1 | 8 | 96 | 22 |
| 13 | 190.20 | 36.600 | 200.0 | 1600.0 | 153.600 | 35.200 | 1 | 8 | 96 | 22 |
| 14 | 190.00 | 5.680 | 200.0 | 40.0 | 184.320 | 5.680 | 5 | 1 | 4608 | 142 |

TABLE 3

| No. | Fif2 [KHz] | Fs2 [MHz] | FD2 [KHz] | Fc2 [KHz] | K2 | M2 | ΔØ2 |
|---|---|---|---|---|---|---|---|
| 1 | — | — | — | — | — | — | — |
| 2 | — | — | — | — | — | — | — |
| 3 | — | — | — | — | — | — | — |
| 4 | — | — | — | — | — | — | — |
| 5 | — | — | — | — | — | — | — |
| 6 | — | — | — | — | — | — | — |
| 7 | 150.0 | 30.72 | 50.000 | 150.10 | 4 | 614 | 3 |
| 8 | — | — | — | — | — | — | — |
| 9 | 150.0 | 30.72 | 50.000 | 150.10 | 4 | 614 | 3 |
| 10 | — | — | — | — | — | — | — |
| 11 | 1000.0 | 30.72 | 40.000 | 1000.00 | 5 | 768 | 25 |
| 12 | 1200.0 | 30.72 | 40.000 | 1200.00 | 5 | 768 | 30 |
| 13 | 1400.0 | 30.72 | 40.000 | 1400.00 | 5 | 768 | 35 |
| 14 | — | — | — | — | — | — | — |

TABLE 4

| No. | Fifa [MHz] | Fif1 [MHz] | FD [KHz] | FD1 [KHz] | Fs1 [MHz] | Fc1 [MHz] | K1 | L1 | M1 | ΔØ1 |
|---|---|---|---|---|---|---|---|---|---|---|
| 1 | 210.35 | 13.742 | 30.0 | 16.0 | 98.304 | 13.728 | 15 | 8 | 6144 | 858 |
| 2 | 210.38 | 13.772 | 30.0 | 16.0 | 98.304 | 13.760 | 15 | 8 | 6144 | 860 |
| 3 | 210.41 | 13.802 | 30.0 | 16.0 | 98.304 | 13.792 | 15 | 8 | 6144 | 862 |
| 4 | 210.35 | 53.064 | 30.0 | 11.3 | 157.286 | 53.055 | 8 | 3 | 13981 | 4716 |
| 5 | 210.38 | 53.094 | 30.0 | 11.3 | 157.286 | 53.089 | 8 | 3 | 13981 | 4719 |
| 6 | 210.41 | 53.124 | 30.0 | 11.3 | 157.286 | 53.123 | 8 | 3 | 13981 | 4722 |

| No. | Fif2 [KHz] | Fs2 [MHz] | FD2 [KHz] | Fc2 [KHz] | K2 | M2 | ΔØ2 |
|---|---|---|---|---|---|---|---|
| 1 | 14.00 | 9.8304 | 2.000 | 14.00 | 7 | 4915 | 7 |
| 2 | 12.00 | 9.8304 | 2.000 | 12.00 | 7 | 4915 | 6 |
| 3 | 10.00 | 9.8304 | 2.000 | 10.00 | 7 | 4915 | 5 |
| 4 | 8.60 | 9.8304 | 1.250 | 8.75 | 6 | 7864 | 7 |
| 5 | 4.90 | 9.8304 | 1.250 | 5.00 | 6 | 7864 | 4 |
| 6 | 1.10 | 9.8304 | 1.250 | 1.25 | 6 | 7864 | 1 |

TABLE 5

| No. | Fifa [MHz] | Fif1 [MHz] | FD [KHz] | FD1 [KHz] | Fs1 [MHz] | Fc1 [MHz] | K1 | L1 | M1 | ΔØ1 |
|---|---|---|---|---|---|---|---|---|---|---|
| 1 | 180.00 | −20.000 | 100.0 | 100.0 | 100.000 | −20.000 | 1 | 1 | 1000 | −200 |
| 2 | 179.80 | −20.200 | 200.0 | 400.0 | 200.000 | −20.400 | 1 | 2 | 500 | −51 |
| 3 | 180.00 | −20.000 | 200.0 | 400.0 | 200.000 | −20.000 | 1 | 2 | 500 | −50 |
| 4 | 180.20 | −19.800 | 200.0 | 400.0 | 200.000 | −20.000 | 1 | 2 | 500 | −50 |

| No. | Fif2 [KHz] | Fs2 [MHz] | FD2 [KHz] | Fc2 [KHz] | K2 | M2 | ΔØ2 |
|---|---|---|---|---|---|---|---|
| 1 | — | — | — | — | — | — | — |
| 2 | 200.0 | 20 | 200.000 | 200.00 | 1 | 100 | 1 |
| 3 | — | — | — | — | — | — | — |
| 4 | 200.0 | 20 | 200.000 | 200.00 | 1 | 100 | 1 |

In the digital-down converter of the present embodiment, where the frequency setting interval FD1 of the frequency converter 31 is settable at a step lower than or equal to the desired frequency setting interval FD of the input signal, each frequency can be input by merely changing the setting of frequency data (phase difference data) to the NCO of the frequency converter 31. Therefore, a data setting time of a controller that controls the digital down-converter can be reduced by half compared with a conventional digital down-converter requiring the setting of data to both frequency converters and the frequency data to the NCO can be computed in a simpler manner.

More specifically, for example, where a frequency is set at a 200 KHz step between a lower IF limit and an upper IF limit on the assumption that the lower IF limit is 180 MHz, the upper IF limit is 200 MHz and the sampling frequency Fs1=153.6 MHz, the digital down-converter in which the frequency setting interval dF of the input signal is 200 KHz can set the phase difference data φ to 132 for the lower IF limit, and to 232 for the upper IF limit by incrementing the phase difference data φ by "1" whenever changing the IF by 200 KHz.

Figure 6:
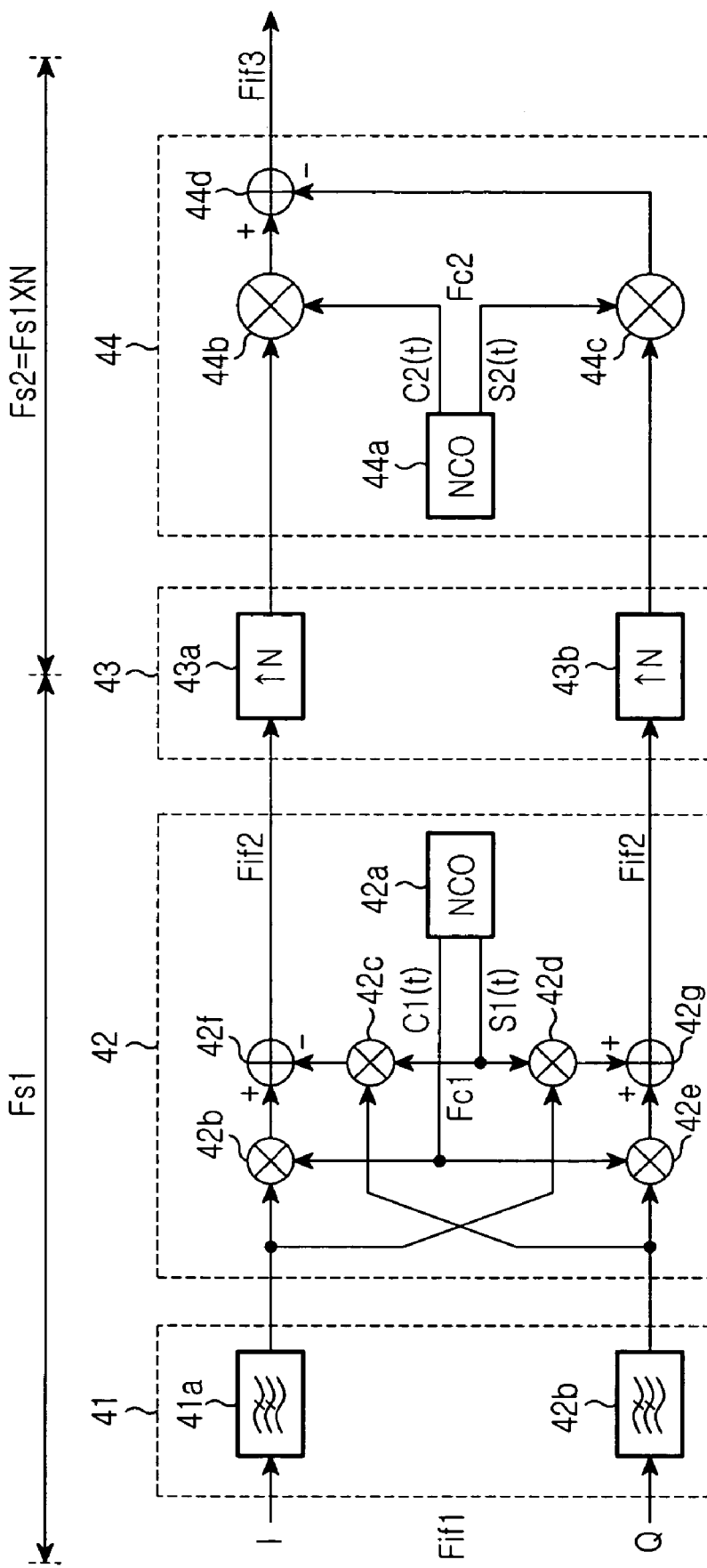
FIG. 6 is a block diagram illustrating the configuration of an alternative embodiment of the digital up-converter using the numerical control oscillator of the first embodiment.

Additionally, the NCO of the first embodiment may be used in a digital up-converter as illustrated in FIG. 6. In the case where a center frequency Fif3 of an output signal is indivisible by a desired frequency setting interval FD of the output signal, the digital up-converter comprises a first frequency converter, and a second frequency converter including the NCO as a local oscillator, and serves to perform two frequency conversions to convert an input signal into a signal with a frequency higher than that of the input signal and output the converted signal as a signal sampled at a sampling frequency Fs.

FIG. 6 is a block diagram illustrating the configuration of an alternative embodiment of the digital up-converter using the NCO of the first embodiment. As illustrated in FIG. 6, the digital up-converter comprises a roll-off filter 41 for band-limiting an input complex signal (containing baseband signal components I and Q) of a center frequency Fif1=0

[Hz] to a target signal band. The roll-off filter 41 includes a real filter 41a and an imaginary filter 41b.

A frequency converter 42 frequency-converts an output signal from the roll-off filter 41 to obtain a complex signal of a center frequency Fif2. The frequency converter 42 includes a local oscillator 42a using the NCO of the first embodiment, for generating a complex local signal of a frequency Fc1 (containing a real component "C1(t)=cos(2π×Fc1×t)" and an imaginary component "S1(t)=sin(2π×Fc1×t)" whose phase is 90 degrees delayed from that of the real component), and multipliers 42b, 42c, 42d and 42e, a subtracter 42f and an adder 42g for performing multiplication, subtraction and addition operations with respect to the output signal from the roll-off filter 41 and the complex local signal generated by the local oscillator 42a, respectively.

An interpolator 43 interpolates the complex signal from the frequency converter 42. To this end, the interpolator 43 includes real and imaginary interpolators 43a and 43b each for multiplying a sampling frequency Fs1 of a corresponding one of real and imaginary components of the complex signal by N to convert it into a sampling frequency Fs2=Fs1×N. A frequency converter 44 frequency-converts an output signal from the interpolator 43 to output a real signal of a target center frequency Fif3. The frequency converter 44 includes a local oscillator 44a using the NCO of the first embodiment, for generating a complex local signal of a frequency Fc2 (containing a real component "C2(t)=cos(2π×Fc2×t)" and an imaginary component "S2(t)=sin(2π×Fc2×t)" whose phase is 90 degrees delayed from that of the real component), multipliers 44b and 44c for multiplying real and imaginary components of the output signal from the interpolator 43 by the real and imaginary components of the complex local signal generated by the local oscillator 44a, respectively, and a subtracter 44d for subtracting output signals from the multipliers 44b and 44c from each other.

For example, assuming that a desired frequency setting interval FD of an output signal is above a frequency setting interval FD2 of the frequency converter 44 and is indivisible by it, the digital up-converter is operated in the following manner. In this case, if K1, K2, and L2 are arbitrary integers, the frequency converter 42 sets phase difference data φ1 to the local oscillator 42a using the NCO of the first embodiment to a value of φ1=Fc1/FD1=Fc1/(FD mod FD2)×K1. Then, the frequency converter 42 converts a baseband signal of a center frequency Fif1 into a complex signal of a center frequency Fif2 using a complex local signal of a frequency Fc1 output from the local oscillator 42a and set to a frequency setting interval of an FD1 step, where FD1=(FD mod FD2)/K1. The local oscillator 42a outputs the complex local signal of the frequency Fc1 by accumulating the phase difference data by a modulo operation taking the nearest integer of M1 as a modulus, where M1=Fs2/(FD mod FD2)×K1.

Also, the frequency converter 44 sets phase difference data φ2 to the local oscillator 44a using the NCO of the first embodiment to a value of φ2=Fc2/FD2=Fc2/FD×K2/L2. The frequency converter 44 converts the complex signal of the center frequency Fif2 into a complex signal of a center frequency Fif3 using a complex local signal of a frequency Fc2 output from the local oscillator 44a and set to a frequency setting interval of an FD2 step, where FD2=FD/K2×L2. Here, the local oscillator 44a outputs the complex local signal of the frequency Fc2 by accumulating the phase difference data by a modulo operation taking the nearest integer of M2 as a modulus, where M2=Fs2/FD×K2/L2.

However, for example, assuming that a desired frequency setting interval FD of an output signal is below a frequency setting interval FD2 of the frequency converter 44 and FD2 is indivisible by FD, the frequency converter 42 sets phase difference data φ1 to the local oscillator 42a using the NCO of the first embodiment to a value of φ1=Fc1/FD1=Fc1/(FD2 mod FD)×K1. The frequency converter 42 converts a baseband signal of a center frequency Fif1 into a complex signal of a center frequency Fif2 using a complex local signal of a frequency Fc1 output from the local oscillator 42a and set to a frequency setting interval of an FD1 step, where FD1=(FD2 mod FD)/K1. Here, the local oscillator 42a outputs the complex local signal of the frequency Fc1 by accumulating the phase difference data by a modulo operation taking the nearest integer of M1 as a modulus, where M1=Fs2/(FD2 mod FD)×K1.

Also, the frequency converter 44 sets phase difference data φ2 to the local oscillator 44a using the NCO of the first embodiment to a value of φ2=Fc2/FD2=Fc2/FD×K2/L2. Then, the frequency converter 44 converts the complex signal of the center frequency Fif2 into a complex signal of a center frequency Fif3 using a complex local signal of a frequency Fc2 output from the local oscillator 44a and set to a frequency setting interval of an FD2 step, where FD2=FD/K2×L2. The local oscillator 44a outputs the complex local signal of the frequency Fc2 by accumulating the phase difference data by a modulo operation taking the nearest integer of M2 as a modulus, where M2=Fs2/FD×K2/L2.

Alternatively, for example, assuming that a desired frequency setting interval FD of an output signal is higher than or equal to a frequency setting interval FD2 of the frequency converter 44 and is evenly divisible by it, or that FD is lower than FD2 and FD2 is evenly divisible by FD, the digital up-converter is operated in the following manner. In this case, the frequency converter 42 sets phase difference data φ1 to the local oscillator 42a using the NCO of the first embodiment to a value of φ1=Fc1/FD1=Fc1/FD×K1. The frequency converter 42 converts a baseband signal of a center frequency Fif1 into a complex signal of a center frequency Fif2 using a complex local signal of a frequency Fc1 output from the local oscillator 42a and set to a frequency setting interval of an FD1 step, where FD1=FD/K1. Here, the local oscillator 42a outputs the complex local signal of the frequency Fc1 by accumulating the phase difference data by a modulo operation taking the nearest integer of M1 as a modulus, where M1=Fs2/FD×K1.

Also, the frequency converter 44 sets phase difference data φ2 to the local oscillator 44a using the NCO of the first embodiment to a value of φ2=Fc2/FD2=Fc2/FD×K2/L2. Then, the frequency converter 44 converts the complex signal of the center frequency Fif2 into a complex signal of a center frequency Fif3 using a complex local signal of a frequency Fc2 output from the local oscillator 44a and set to a frequency setting interval of an FD2 step, where FD2=FD/K2×L2. The local oscillator 44a outputs the complex local signal of the frequency Fc2 by accumulating the phase difference data by a modulo operation taking the nearest integer of M2 as a modulus, where M2=Fs2/FD×K2/L2.

However, in the case where a multiple of the frequency setting interval FD2 of the frequency converter 44 is equal to that of the frequency setting interval FD of the output signal, the digital up-converter with the above-described configuration can set the frequency setting interval of its output signal to FD by means of only the frequency converter 44. In this case, the frequency conversion by the frequency converter 42 may be stopped.

In the digital-up converter of the present embodiment, in the case where the frequency setting interval FD2 of the frequency converter 44 is settable at a step lower than or equal to the desired frequency setting interval FD of the output signal, each frequency can be input by merely changing the setting of frequency data (phase difference data) to the NCO of the frequency converter 44. Therefore, a data setting time of a controller that controls the digital up-converter can be reduced by half compared with a conventional digital up-converter requiring the setting of data to both frequency converters and the frequency data to the NCO can be computed in a simpler manner.

Figure 7:
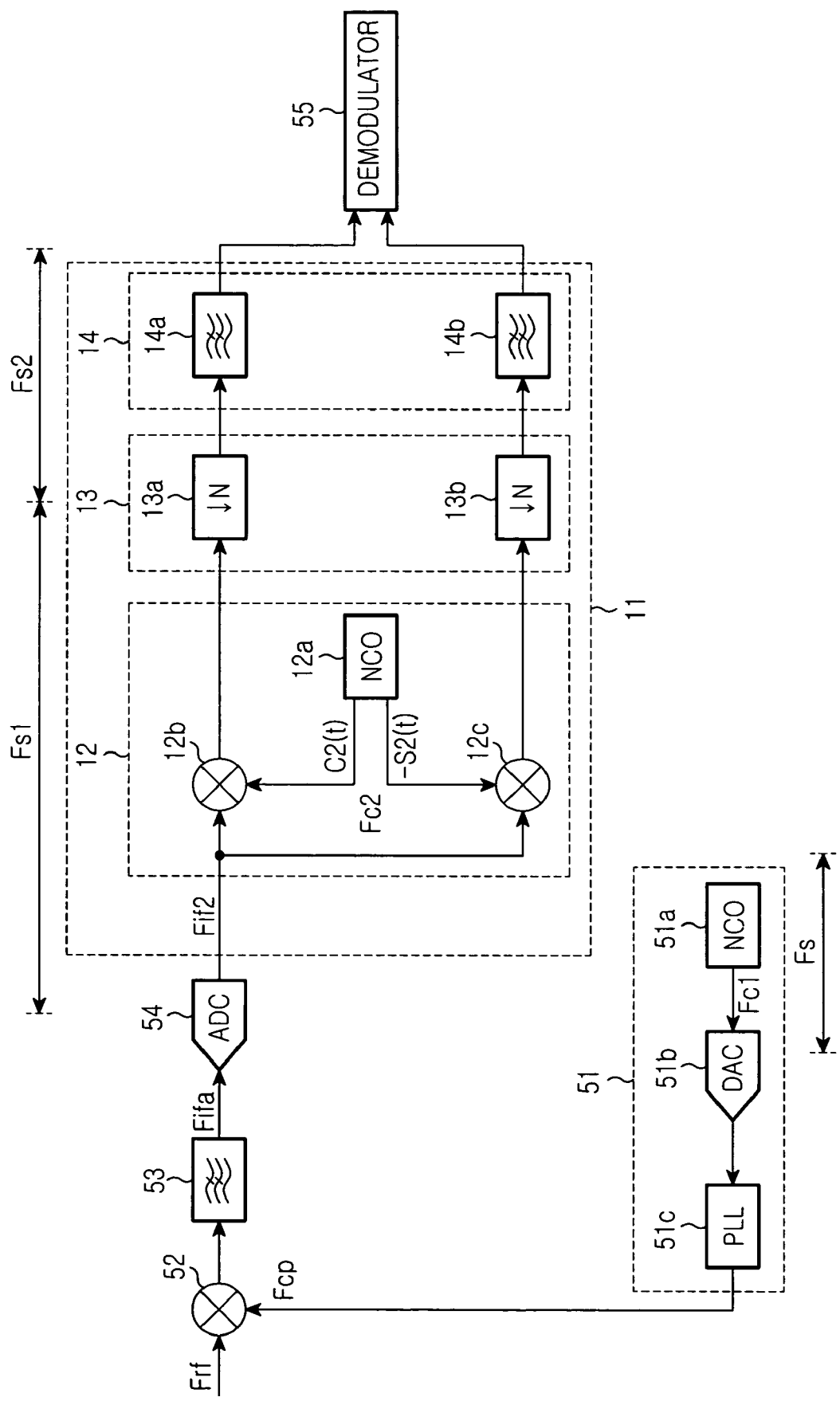
FIG. 7 is a block diagram illustrating the configuration of an embodiment of a receiver using the numerical control oscillator of the first embodiment.

FIG. 7 is a block diagram illustrating the configuration of an embodiment of a receiver using the NCO of the first embodiment. As illustrated in FIG. 7, the receiver comprises a local oscillator 51 including the NCO 51*a* of the first embodiment, a digital to analog converter (DAC) 51*b* for digital/analog-converting an output signal from the NCO 51*a*, and a PLL circuit 51*c* for receiving an output signal from the DAC 51*b* as a reference signal. The receiver further comprises a mixer 52 for frequency-converting a received signal (real signal) of a center frequency Frf into an analog intermediate frequency (IF) signal of a center frequency Fifa on the basis of an analog local signal (real signal "C(t)=cos (2πxFcpxt)") of a frequency Fcp output from the local oscillator 51.

Assuming that a multiplication ratio of the PLL circuit 51*c* is P and an output frequency of the NCO 51*a* is Fc1, the local oscillator 51 outputs an analog local signal of a frequency Fcp=Frf−Fifa=Fc1×P. Also, a frequency setting step FDP of the analog local signal (frequency setting interval of the mixer 52) is a multiplication of a frequency setting step FD of the NCO 51*a* by P.

A band pass filter 53 has a pass frequency band characteristic corresponding to a frequency band of the analog IF signal and acts to extract the analog IF signal from the mixer 52 and output it to an analog to digital converter (ADC) 54.

The ADC 54 quantizes the analog IF signal from the band pass filter 53 and generates a "Sub-Nyquist sampled" digital IF signal of a center frequency Fif2.

The digital down-converter 11 of FIG. 3 is used to convert an output signal from the ADC 54 into a complex signal (I,Q) of a frequency desired by a demodulator 55 and output the converted complex signal to the demodulator 55. The demodulator 55 demodulates the output signal from the digital down-converter 11 to extract received data therefrom.

For example, assuming that a desired frequency setting interval FD of a received signal is above a frequency setting interval FDP of the mixer 52 and is indivisible by it, the receiver is operated in the following manner. In this case, if K1, K2 and L1 are arbitrary integers, the mixer 52 sets phase difference data φ1 to the NCO 51*a* of the first embodiment operating at a sampling frequency Fs to a value of φ1=Fc1/FD1=Fc1/FD×K1/L1. The mixer 52 converts a received signal of a center frequency Frf into an analog IF signal of a center frequency Fifa using an analog local signal of a frequency Fcp output from the local oscillator 51 and set to a frequency setting interval of an FDP step, where FDP=FD/K1×L1. Here, the local oscillator 51 outputs the analog local signal of the frequency Fcp by accumulating the phase difference data by a modulo operation taking the nearest integer of M1 as a modulus, where M1=Fs/FD×K1/L1×P.

Also, the frequency converter 12 sets phase difference data φ2 to the local oscillator 12*a* using the NCO of the first embodiment to a value of φ2=Fc2/FD2=Fc2/(FD mod FDP)×K2. Then, the frequency converter 12 converts a digital IF signal of a center frequency Fif2 and sampling frequency Fs1, generated by Sub-Nyquist sampling the analog IF signal of the center frequency Fifa by the ADC 54, into a complex signal of a frequency desired by the demodulator 55 using a complex local signal of a frequency Fc2 output from the local oscillator 12*a* and set to a frequency setting interval of an FD2 step, where FD2=(FD mod FDP)/K2. The local oscillator 12*a* outputs the complex local signal of the frequency Fc2 by accumulating the phase difference data by a modulo operation taking the nearest integer of M2 as a modulus, where M2=Fs1/(FD mod FDP)×K2.

However, for example, assuming that a desired frequency setting interval FD of a received signal is below a frequency setting interval FDP of the mixer 52 and FDP is indivisible by FD, the mixer 52 sets phase difference data φ1 to the NCO 51*a* of the first embodiment operating at a sampling frequency Fs to a value of φ1=Fc1/FD1=Fc1/FD×K1/L1. The mixer 52 converts a received signal of a center frequency Frf into an analog IF signal of a center frequency Fifa using an analog local signal of a frequency Fcp output from the local oscillator 51 and set to a frequency setting interval of an FDP step, where FDP=FD/K1×L1. Here, the local oscillator 51 outputs the analog local signal of the frequency Fcp by accumulating the phase difference data by a modulo operation taking the nearest integer of M1 as a modulus, where M1=Fs/FD×K1/L1×P.

Also, the frequency converter 12 sets phase difference data φ2 to the local oscillator 12*a* using the NCO of the first embodiment to a value of φ2=Fc2/FD2=Fc2/(FDP mod FD)×K2. The frequency converter 12 converts a digital IF signal of a center frequency Fif2 and sampling frequency Fs1, generated by Sub-Nyquist sampling the analog IF signal of the center frequency Fifa by the ADC 54, into a complex signal of a frequency desired by the demodulator 55 using a complex local signal of a frequency Fc2 output from the local oscillator 12*a* and set to a frequency setting interval of an FD2 step, where FD2=(FDP mod FD)/K2. The local oscillator 12*a* outputs the complex local signal of the frequency Fc2 by accumulating the phase difference data by a modulo operation taking the nearest integer of M2 as a modulus, where M2=Fs1/(FDP mod FD)×K2.

Alternatively, for example, assuming that a desired frequency setting interval FD of a received signal is higher than or equal to a frequency setting interval FDP of the mixer 52 and is evenly divisible by it, or that FD is lower than FDP and FDP is evenly divisible by FD, the mixer 52 sets phase difference data φ1 to the NCO 51*a* of the first embodiment operating at a sampling frequency Fs to a value of φ1=Fc1/FD1=Fc1/FD×K1/L1. The mixer 52 converts a received signal of a center frequency Frf into an analog IF signal of a center frequency Fifa using an analog local signal of a frequency Fcp output from the local oscillator 51 and set to a frequency setting interval of an FDP step, where FDP=FD/K1×L1. The local oscillator 51 outputs the analog local signal of the frequency Fcp by accumulating the phase difference data by a modulo operation taking the nearest integer of M1 as a modulus, where M1=Fs/FD×K1/L1×P.

Also, the frequency converter 12 sets phase difference data φ2 to the local oscillator 12*a* using the NCO of the first embodiment to a value of φ2=Fc2/FD2=Fc2/FD×K2. Then, the frequency converter 12 converts a digital IF signal of a center frequency Fif2 and sampling frequency Fs1, generated by Sub-Nyquist sampling the analog IF signal of the center frequency Fifa by the ADC 54, into a complex signal of a frequency desired by the demodulator 55 using a complex local signal of a frequency Fc2 output from the local oscillator 12a and set to a frequency setting interval of an FD2 step, where FD2=FD/K2. Here, the local oscillator 12a outputs the complex local signal of the frequency Fc2 by accumulating the phase difference data by a modulo operation taking the nearest integer of M2 as a modulus, where M2=Fs1/FD×K2.

On the other hand, in the case where a multiple of the frequency setting interval FDP of the mixer 52 is equal to that of the frequency setting interval FD of the received signal, the receiver with the above-described configuration can convert the frequency of the received signal input thereto at the frequency setting interval FD into that desired by the demodulator 55 by means of only the mixer 52. In this case, the frequency conversion by the frequency converter 12 may be stopped.

Further, the receiver with the above-stated configuration can have various settings of the respective parameters as shown in the below tables 6 to 9. The tables 6 and 7 show examples of settings of the respective parameters in a W-CDMA system, the table 8 shows examples of settings of the respective parameters in an IS-95 Band (Class 0 system, and the table 9 shows examples of settings of the respective parameters in an IEEE 802.11a system.

TABLE 6

| No. | Frf [MHz] | Fcp [MHz] | P | FD [KHz] | FDP [KHz] | Fs [MHz] | FD1 [KHz] | Fc1 [MHz] | K1 | L1 |
|---|---|---|---|---|---|---|---|---|---|---|
| 1 | 2257.50 | 2068.00 | 200 | 200.0 | 4000.0 | 61.440 | 20.0 | 10.340 | 1 | 20 |
| 2 | 2257.50 | 2068.00 | 100 | 200.0 | 4000.0 | 92.160 | 40.0 | 20.680 | 1 | 20 |
| 3 | 2257.50 | 2068.00 | 100 | 200.0 | 4000.0 | 122.880 | 40.0 | 20.680 | 1 | 20 |
| 4 | 2247.50 | 2060.00 | 100 | 200.0 | 5000.0 | 153.600 | 50.0 | 20.600 | 1 | 25 |
| 5 | 2252.50 | 2065.00 | 100 | 200.0 | 5000.0 | 153.600 | 50.0 | 20.650 | 1 | 25 |
| 6 | 2257.50 | 2070.00 | 100 | 200.0 | 5000.0 | 153.600 | 50.0 | 20.700 | 1 | 25 |
| 7 | 2257.52 | 2070.00 | 100 | 200.0 | 5000.0 | 153.600 | 50.0 | 20.700 | 1 | 25 |
| 8 | 2262.50 | 2075.00 | 100 | 200.0 | 5000.0 | 153.600 | 50.0 | 20.750 | 1 | 25 |
| 9 | 2262.54 | 2075.00 | 100 | 200.0 | 5000.0 | 153.600 | 50.0 | 20.750 | 1 | 25 |
| 10 | 2267.50 | 2080.00 | 100 | 200.0 | 5000.0 | 153.600 | 50.0 | 20.800 | 1 | 25 |
| 11 | 2257.50 | 2066.40 | 128 | 200.0 | 2400.0 | 153.600 | 18.8 | 16.144 | 1 | 12 |
| 12 | 2257.50 | 2066.40 | 128 | 200.0 | 2400.0 | 153.600 | 18.8 | 16.144 | 1 | 12 |
| 13 | 2257.50 | 2066.40 | 128 | 200.0 | 2400.0 | 153.600 | 18.8 | 16.144 | 1 | 12 |
| 14 | 2257.50 | 2070.00 | 50 | 200.0 | 5000.0 | 150.000 | 100.0 | 41.400 | 1 | 25 |

TABLE 7

| No. | M1 | ΔØ1 | Fifa [MHz] | Fif2 [MHz] | Fs1 [MHz] | FD2 [KHz] | Fc2 [MHz] | K2 | M2 | ΔØ2 |
|---|---|---|---|---|---|---|---|---|---|---|
| 1 | 3072 | 517 | 189.50 | 35.90 | 153.6 | 100.000 | 35.90 | 2 | 1536 | 359 |
| 2 | 2304 | 517 | 189.50 | 35.90 | 153.6 | 100.000 | 35.90 | 2 | 1536 | 359 |
| 3 | 3072 | 517 | 189.50 | 35.90 | 153.6 | 100.000 | 35.90 | 2 | 1536 | 359 |
| 4 | 3072 | 412 | 187.50 | 33.90 | 153.6 | 100.000 | 33.90 | 2 | 1536 | 339 |
| 5 | 3072 | 413 | 187.50 | 33.90 | 153.6 | 100.000 | 33.90 | 2 | 1536 | 339 |
| 6 | 3072 | 414 | 187.50 | 33.90 | 153.6 | 100.000 | 33.90 | 2 | 1536 | 339 |
| 7 | 3072 | 414 | 187.52 | 33.92 | 153.6 | 20.000 | 33.92 | 10 | 7680 | 1696 |
| 8 | 3072 | 415 | 187.50 | 33.90 | 153.6 | 100.000 | 33.90 | 2 | 1536 | 339 |
| 9 | 3072 | 415 | 187.54 | 33.94 | 153.6 | 20.000 | 33.94 | 10 | 7680 | 1697 |
| 10 | 3072 | 416 | 187.50 | 33.90 | 153.6 | 100.000 | 33.90 | 2 | 1536 | 339 |
| 11 | 8192 | 861 | 191.10 | 37.50 | 153.6 | 100.000 | 37.50 | 2 | 1536 | 375 |
| 12 | 8192 | 861 | 191.10 | 37.50 | 153.6 | 100.000 | 37.50 | 2 | 1536 | 375 |
| 13 | 8192 | 861 | 191.10 | 37.50 | 153.6 | 100.000 | 37.50 | 2 | 1536 | 375 |
| 14 | 1500 | 414 | 187.50 | 33.90 | 153.6 | 100.000 | 33.90 | 2 | 1536 | 339 |

TABLE 8

| No. | Frf [MHz] | Fcp [MHz] | P | FD [KHz] | FDP [KHz] | Fs [MHz] | FD1 [KHz] | Fc1 [MHz] | K1 | L1 |
|---|---|---|---|---|---|---|---|---|---|---|
| 1 | 869.97 | 679.68 | 50 | 30.0 | 960.0 | 98.304 | 19.2 | 13.594 | 1 | 32 |
| 2 | 870.00 | 679.68 | 50 | 30.0 | 960.0 | 98.304 | 19.2 | 13.594 | 1 | 32 |
| 3 | 870.03 | 679.68 | 50 | 30.0 | 960.0 | 98.304 | 19.2 | 13.594 | 1 | 32 |
| 4 | 869.97 | 679.68 | 50 | 30.0 | 960.0 | 157.286 | 19.2 | 13.594 | 1 | 32 |
| 5 | 870.00 | 679.68 | 50 | 30.0 | 960.0 | 157.286 | 19.2 | 13.594 | 1 | 32 |
| 6 | 870.03 | 679.68 | 50 | 30.0 | 960.0 | 157.286 | 19.2 | 13.594 | 1 | 32 |

| No. | M1 | ΔØ1 | Fifa [MHz] | Fif2 [MHz] | Fs1 [MHz] | FD2 [KHz] | Fc2 [MHz] | K2 | M2 | ΔØ2 |
|---|---|---|---|---|---|---|---|---|---|---|
| 1 | 5120 | 708 | 190.29 | 33.00 | 157.286 | 3.750 | 33.00 | 8 | 41943 | 8801 |
| 2 | 5120 | 708 | 190.32 | 33.03 | 157.286 | 3.750 | 33.03 | 8 | 41943 | 8809 |
| 3 | 5120 | 708 | 190.35 | 33.06 | 157.286 | 3.750 | 33.06 | 8 | 41943 | 8817 |
| 4 | 8192 | 708 | 190.29 | 33.00 | 157.286 | 3.750 | 33.00 | 8 | 41943 | 8801 |

TABLE 8-continued

| 5 | 8192 | 708 | 190.32 | 33.03 | 157.286 | 3.750 | 33.03 | 8 | 41943 | 8809 |
| 6 | 8192 | 708 | 190.35 | 33.06 | 157.286 | 3.750 | 33.06 | 8 | 41943 | 8817 |

TABLE 9

| No. | Frf [MHz] | Fcp [MHz] | P | FD [KHz] | FDP [KHz] | Fs [MHz] | FD1 [KHz] | Fc1 [MHz] | K1 | L1 |
|---|---|---|---|---|---|---|---|---|---|---|
| 1 | 5200.00 | 5010.00 | 200 | 100.0 | 10000.0 | 100.0 | 50.0 | 25.050 | 1 | 100 |
| 2 | 5180.00 | 4990.00 | 128 | 200.0 | 10000.0 | 200.0 | 78.1 | 38.984 | 1 | 50 |
| 3 | 5200.00 | 5010.00 | 128 | 200.0 | 10000.0 | 200.0 | 78.1 | 39.141 | 1 | 50 |
| 4 | 5220.00 | 5030.00 | 128 | 200.0 | 10000.0 | 200.0 | 78.1 | 39.297 | 1 | 50 |

| No. | M1 | ΔØ1 | Fifa [MHz] | Fif2 [MHz] | Fs1 [MHz] | FD2 [KHz] | Fc2 [MHz] | K2 | M2 | ΔØ2 |
|---|---|---|---|---|---|---|---|---|---|---|
| 1 | 2000 | 501 | 190.00 | −10.00 | 100 | 100.000 | −10.00 | 1 | 1000 | −100 |
| 2 | 2560 | 499 | 190.00 | −10.00 | 200 | 200.000 | −10.00 | 1 | 1000 | −50 |
| 3 | 2560 | 501 | 190.00 | −10.00 | 200 | 200.000 | −10.00 | 1 | 1000 | −50 |
| 4 | 2560 | 503 | 190.00 | −10.00 | 200 | 200.000 | −10.00 | 1 | 1000 | −50 |

In the receiver of the present embodiment, where the frequency setting interval FDP of the mixer 52 is settable at a step lower than or equal to the desired frequency setting interval FD of the received signal, each frequency can be input by merely changing the setting of frequency data (phase difference data) to the NCO of the local oscillator 51. Therefore, a data setting time of a controller that controls the receiver can be reduced compared with a conventional receiver and the frequency data to the NCO can be computed in a simpler manner.

Figure 8:
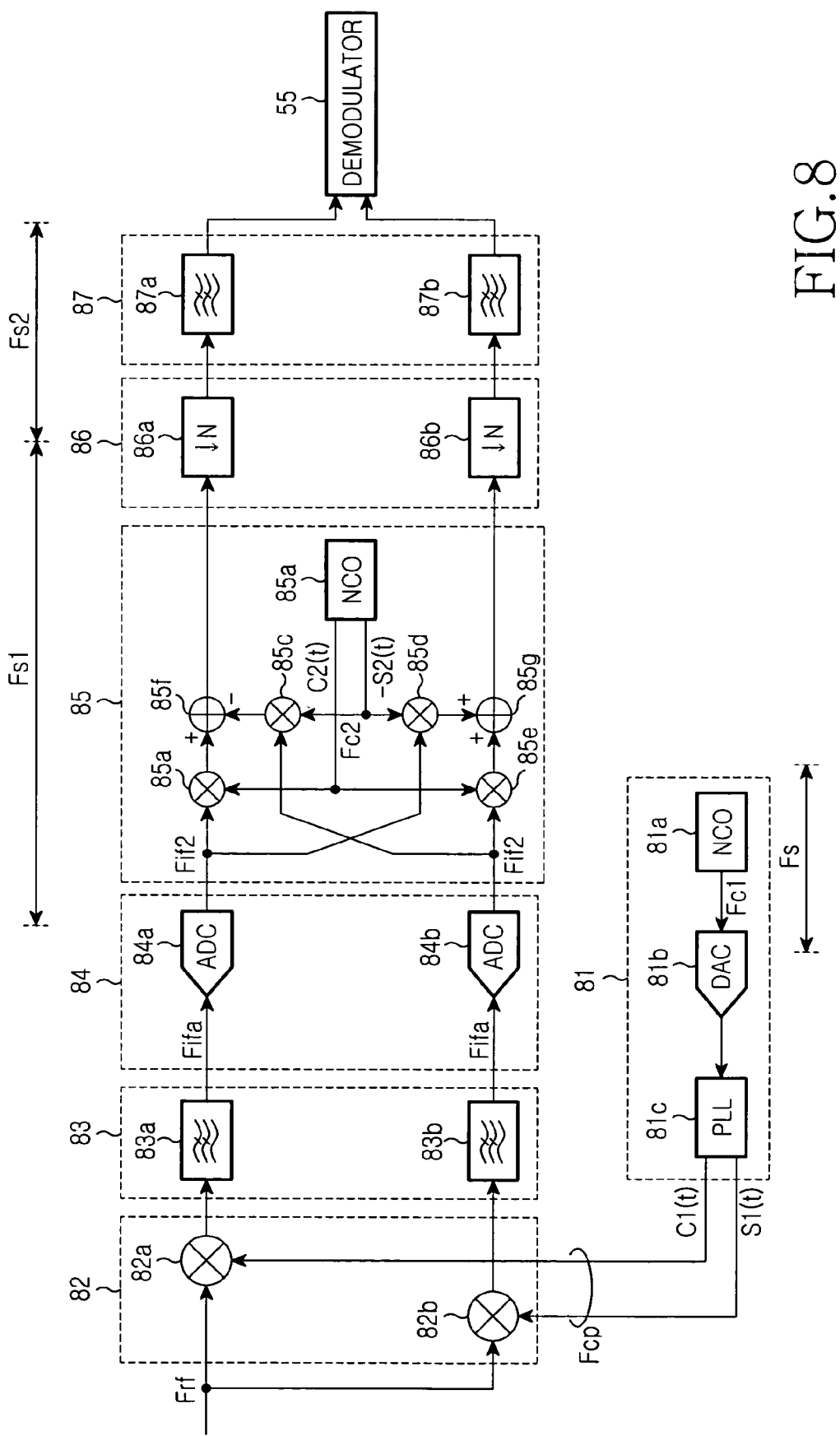
FIG. 8 is a block diagram illustrating the configuration of an alternative embodiment of the receiver using the numerical control oscillator of the first embodiment.

FIG. 8 is a block diagram illustrating the configuration of an alternative embodiment of the receiver using the NCO of the first embodiment, wherein a quadrature demodulator 82 is used instead of the mixer 52 of the receiver illustrated in FIG. 7 to quadrature-demodulate an analog version of a received signal. Referring to FIG. 8, the receiver comprises a local oscillator 81 including the NCO 81a of the first embodiment, a DAC 81b for digital/analog-converting an output signal from the NCO 81a, and a PLL circuit 81c for receiving an output signal from the DAC 81b as a reference signal. The quadrature demodulator 82 frequency-converts a received signal (real signal) of a center frequency Frf into an analog IF complex signal of a center frequency Fifa on the basis of an analog local signal (containing a real component "C1(t)=cos(2π×Fcp×t)" and an imaginary component "−S1(t)=−sin(2π×Fcp×t)" whose phase is 90 degrees ahead of that of the real component) of a frequency Fcp output from the local oscillator 81. To this end, the quadrature demodulator 82 includes a real mixer 82a and an imaginary mixer 82b.

Assuming that a multiplication ratio of the PLL circuit 81c is P and an output frequency of the NCO 81a is Fc1, the local oscillator 81 outputs an analog local signal of a frequency Fcp=Frf−Fifa=Fc1×P. Also, a frequency setting step FDP of the analog local signal (frequency setting interval of the quadrature demodulator 82) is a multiplication of a frequency setting step FD of the NCO 81a by P.

A band pass filter 83 has a pass frequency band characteristic corresponding to a frequency band of the analog IF complex signal and acts to extract the analog IF complex signal from the quadrature demodulator 82 and output it to an ADC 84. To this end, the band pass filter 83 includes a real band pass filter 83a and an imaginary band pass filter 83b.

The ADC 84 quantizes the analog IF complex signal from the band pass filter 83 and generates a digital IF signal of a center frequency Fif2. The ADC 84 includes a real ADC 84a and an imaginary ADC 84b.

A frequency converter 85 frequency-converts an output signal from the ADC 84. The frequency converter 85 includes a local oscillator 85a using the NCO of the first embodiment, for generating a complex local signal of a frequency Fc2 (containing a real component "C2(t)=cos(2π×Fc2×t)" and an imaginary component "−S2(t)=−sin(2π×Fc2×t)" whose phase is 90 degrees ahead of that of the real component), and multipliers 85b, 85c, 85d, and 85e, a subtracter 85f and an adder 85g for performing multiplication, subtraction and addition operations with respect to the output signal from the ADC 84 and the complex local signal generated by the local oscillator 85a, respectively.

A decimator 86 decimates a complex signal from the frequency converter 85. The decimator 86 includes real and imaginary decimators 86a and 86b each for multiplying a sampling frequency Fs1 of a corresponding one of real and imaginary components of the complex signal by 1/N to convert it into a sampling frequency Fs2=Fs1/N. A roll-off filter 87 band-limits an output signal from the decimator 86 to a target signal band and outputs the resulting complex signal (I,Q) of the frequency desired by the demodulator 55 thereto. The roll-off filter 87 includes a real filter 87a and an imaginary filter 87b.

In the above-described receiver, the NCO 81a, local oscillator 81, local oscillator 85a and frequency converter 85 perform the same operations as those of the NCO 51a, local oscillator 51, local oscillator 12a and frequency converter 12 in the receiver previously stated with reference to FIG. 7 on the basis of the relations between the desired frequency setting interval FD of the received signal and the frequency setting interval FDP of the quadrature demodulator 82, respectively.

However, in the case where a multiple of the frequency setting interval FDP of the quadrature demodulator 82 is equal to that of the frequency setting interval FD of the received signal, the receiver with the above-described configuration can convert the frequency of the received signal input thereto at the frequency setting interval FD into that desired by the demodulator by means of only the quadrature demodulator 82. In this case, the frequency conversion by the frequency converter 85 may be stopped.

Further, the receiver with the above-stated configuration can have various settings of the respective parameters as shown in the below tables 10 to 13. The tables 10 and 11 show examples of settings of the respective parameters in a W-CDMA system, the table 12 shows examples of settings of the respective parameters in an IS-95 Band (Class 0) system, and the table 13 shows examples of settings of the respective parameters in an IEEE 802.11a system

TABLE 10

| No. | Frf [MHz] | Fcp [MHz] | P | FD [KHz] | FDP [KHz] | Fs [MHz] | FD1 [KHz] | Fc1 [MHz] | K1 | L1 |
|---|---|---|---|---|---|---|---|---|---|---|
| 1 | 2257.50 | 2256.00 | 200.0 | 200.0 | 4000.0 | 61.440 | 20.0 | 11.280 | 1 | 20 |
| 2 | 2257.50 | 2256.00 | 100.0 | 200.0 | 4000.0 | 92.160 | 40.0 | 22.560 | 1 | 20 |
| 3 | 2257.50 | 2256.00 | 100.0 | 200.0 | 4000.0 | 122.880 | 40.0 | 22.560 | 1 | 20 |
| 4 | 2247.50 | 2250.00 | 100.0 | 200.0 | 5000.0 | 153.600 | 50.0 | 22.500 | 1 | 25 |
| 5 | 2252.50 | 2255.00 | 100.0 | 200.0 | 5000.0 | 153.600 | 50.0 | 22.550 | 1 | 25 |
| 6 | 2257.50 | 2260.00 | 100.0 | 200.0 | 5000.0 | 153.600 | 50.0 | 22.600 | 1 | 25 |
| 7 | 2257.52 | 2260.00 | 100.0 | 200.0 | 5000.0 | 153.600 | 50.0 | 22.600 | 1 | 25 |
| 8 | 2262.50 | 2265.00 | 100.0 | 200.0 | 5000.0 | 153.600 | 50.0 | 22.650 | 1 | 25 |
| 9 | 2262.54 | 2265.00 | 100.0 | 200.0 | 5000.0 | 153.600 | 50.0 | 22.650 | 1 | 25 |
| 10 | 2267.50 | 2270.00 | 100.0 | 200.0 | 5000.0 | 153.600 | 50.0 | 22.700 | 1 | 25 |
| 11 | 2257.50 | 2258.40 | 128.0 | 200.0 | 2400.0 | 153.600 | 18.8 | 17.644 | 1 | 12 |
| 12 | 2257.50 | 2258.40 | 128.0 | 200.0 | 2400.0 | 153.600 | 18.8 | 17.644 | 1 | 12 |
| 13 | 2257.50 | 2258.40 | 128.0 | 200.0 | 2400.0 | 153.600 | 18.8 | 17.644 | 1 | 12 |
| 14 | 2257.50 | 2260.00 | 50.0 | 200.0 | 5000.0 | 150.000 | 100.0 | 45.200 | 1 | 25 |

TABLE 11

| No. | M1 | ΔØ1 | Fifa [MHz] | Fif2 [MHz] | Fs1 [MHz] | FD2 [KHz] | Fc2 [MHz] | K2 | M2 | ΔØ2 |
|---|---|---|---|---|---|---|---|---|---|---|
| 1 | 3072 | 564 | 1.50 | 1.50 | 30.72 | 25.000 | 1.50 | 8 | 1229 | 60 |
| 2 | 2304 | 564 | 1.50 | 1.50 | 30.72 | 25.000 | 1.50 | 8 | 1229 | 60 |
| 3 | 3072 | 564 | 1.50 | 1.50 | 30.72 | 25.000 | 1.50 | 8 | 1229 | 60 |
| 4 | 3072 | 450 | −2.50 | −2.50 | 30.72 | 20.000 | −2.50 | 10 | 1536 | −125 |
| 5 | 3072 | 451 | −2.50 | −2.50 | 30.72 | 20.000 | −2.50 | 10 | 1536 | −125 |
| 6 | 3072 | 452 | −2.50 | −2.50 | 30.72 | 20.000 | −2.50 | 10 | 1536 | −125 |
| 7 | 3072 | 452 | −2.48 | −2.48 | 30.72 | 20.000 | −2.48 | 10 | 1539 | −124 |
| 8 | 3072 | 453 | −2.50 | −2.50 | 30.72 | 20.000 | −2.50 | 10 | 1536 | −125 |
| 9 | 3072 | 453 | −2.46 | −2.46 | 30.72 | 20.000 | −2.46 | 10 | 1536 | −123 |
| 10 | 3072 | 454 | −2.50 | −2.50 | 30.72 | 20.000 | −2.50 | 10 | 1536 | −125 |
| 11 | 8192 | 941 | −0.90 | −0.90 | 30.72 | 33.333 | −0.90 | 6 | 922 | −27 |
| 12 | 8192 | 941 | −0.90 | −0.90 | 30.72 | 33.333 | −0.90 | 6 | 922 | −27 |
| 13 | 8192 | 941 | −0.90 | −0.90 | 30.72 | 33.333 | −0.90 | 6 | 922 | −27 |
| 14 | 1500 | 452 | −2.50 | −2.50 | 30.72 | 20.000 | −2.50 | 10 | 1536 | −125 |

TABLE 12

| No. | Frf [MHz] | Fcp [MHz] | P | FD [KHz] | FDP [KHz] | Fs [MHz] | FD1 [KHz] | Fc1 [MHz] | K1 | L1 |
|---|---|---|---|---|---|---|---|---|---|---|
| 1 | 869.97 | 869.76 | 50 | 30.0 | 960.0 | 98.304 | 19.2 | 17.395 | 1 | 32 |
| 2 | 870.00 | 869.76 | 50 | 30.0 | 960.0 | 98.304 | 19.2 | 17.395 | 1 | 32 |
| 3 | 870.03 | 869.76 | 50 | 30.0 | 960.0 | 98.304 | 19.2 | 17.395 | 1 | 32 |
| 4 | 869.97 | 869.76 | 50 | 30.0 | 960.0 | 157.286 | 19.2 | 17.395 | 1 | 32 |
| 5 | 870.00 | 869.76 | 50 | 30.0 | 960.0 | 157.286 | 19.2 | 17.395 | 1 | 32 |
| 6 | 870.03 | 869.76 | 50 | 30.0 | 960.0 | 157.286 | 19.2 | 17.395 | 1 | 32 |

| No. | M1 | ΔØ1 | Fifa [MHz] | Fif2 [MHz] | Fs1 [MHz] | FD2 [KHz] | Fc2 [MHz] | K2 | M2 | ΔØ2 |
|---|---|---|---|---|---|---|---|---|---|---|
| 1 | 5120 | 906 | 0.21 | 0.21 | 9.8304 | 30.000 | 0.21 | 1 | 328 | 7 |
| 2 | 5120 | 906 | 0.24 | 0.24 | 9.8304 | 30.000 | 0.24 | 1 | 328 | 8 |
| 3 | 5120 | 906 | 0.27 | 0.27 | 9.8304 | 30.000 | 0.27 | 1 | 328 | 9 |
| 4 | 8192 | 906 | 0.21 | 0.21 | 9.8304 | 30.000 | 0.21 | 1 | 328 | 7 |
| 5 | 8192 | 906 | 0.24 | 0.24 | 9.8304 | 30.000 | 0.24 | 1 | 328 | 8 |
| 6 | 8192 | 906 | 0.27 | 0.27 | 9.8304 | 30.000 | 0.27 | 1 | 328 | 9 |

TABLE 13

| No. | Frf [MHz] | Fcp [MHz] | P | FD [KHz] | FDP [KHz] | Fs [MHz] | FD1 [KHz] | Fc1 [MHz] | K1 | L1 |
|---|---|---|---|---|---|---|---|---|---|---|
| 1 | 5200.00 | 5200.00 | 200 | 100.0 | 10000.0 | 100.0 | 50.0 | 26.000 | 1 | 100 |
| 2 | 5180.00 | 5180.00 | 128 | 200.0 | 10000.0 | 200.0 | 78.1 | 40.469 | 1 | 50 |
| 3 | 5200.00 | 5200.00 | 128 | 200.0 | 10000.0 | 200.0 | 78.1 | 40.625 | 1 | 50 |
| 4 | 5220.00 | 5220.00 | 128 | 200.0 | 10000.0 | 200.0 | 78.1 | 40.781 | 1 | 50 |

| No. | M1 | ΔØ1 | Fifa [MHz] | Fif2 [MHz] | Fs1 [MHz] | FD2 [KHz] | Fc2 [MHz] | K2 | M2 | ΔØ2 |
|---|---|---|---|---|---|---|---|---|---|---|
| 1 | 2000 | 520 | 0.00 | 0.00 | 100 | — | — | — | — | — |
| 2 | 2560 | 518 | 0.00 | 0.00 | 200 | — | — | — | — | — |
| 3 | 2560 | 520 | 0.00 | 0.00 | 200 | — | — | — | — | — |
| 4 | 2560 | 522 | 0.00 | 0.00 | 200 | — | — | — | — | — |

In the receiver of the present embodiment, in the case where the frequency setting interval FDP of the quadrature demodulator 82 is settable at a step lower than or equal to the desired frequency setting interval FD of the received signal, each frequency can be input by merely changing the setting of frequency data (phase difference data) to the NCO of the local oscillator 81. Therefore, a data setting time of a controller that controls the receiver can be reduced compared with a conventional receiver and the frequency data to the NCO can be computed in a simpler manner.

Further, in the receiver of the present embodiment, the center frequency Fifa of the analog IF complex signal can be set to a lower value, thereby making it possible to apply a relatively small number of phase amplitude data to the local oscillator 85a using the NCO of the first embodiment, constructing the downstream frequency converter 85.

Figure 9:
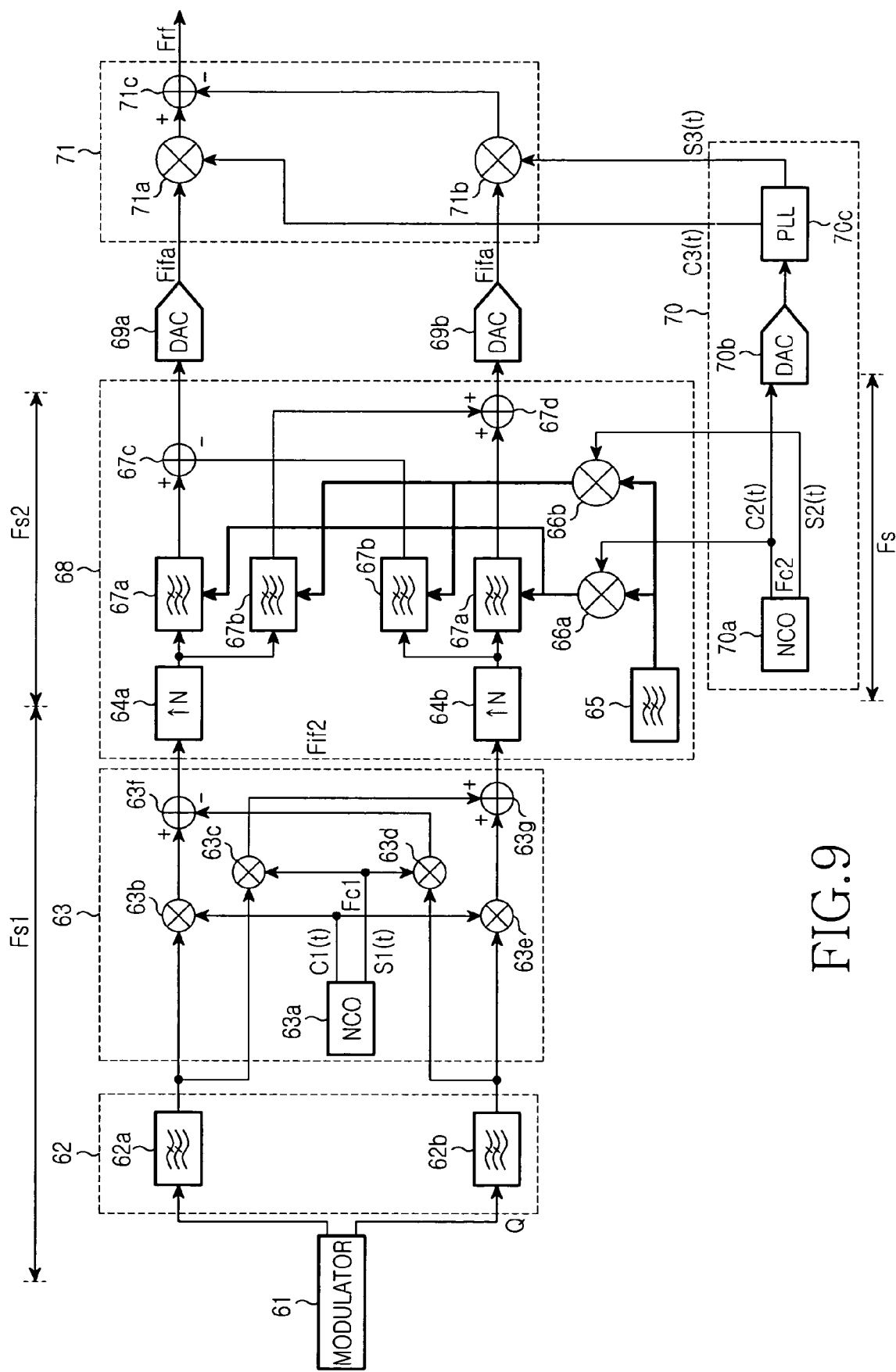
FIG. 9 is a block diagram illustrating the configuration of a transmitter using the numerical control oscillator of the first embodiment.

The NCO of the first embodiment may also be used in a transmitter as shown in FIG. 9. FIG. 9 is a block diagram illustrating the configuration of a transmitter using the NCO of the first embodiment. As illustrated in FIG. 9, the transmitter comprises a modulator 61 for modulating a carrier based on transmit data to be transmitted from the transmitter, and a roll-off filter 62 for band-limiting a complex signal (containing baseband signal components I and Q) output from the modulator 61 to a target signal band. The roll-off filter 62 includes a real filter 62a and an imaginary filter 62b.

A frequency converter 63 frequency-converts an output signal from the roll-off filter 62 to obtain a complex signal of a center frequency Fif2. The frequency converter 63 includes a local oscillator 63a using the NCO of the first embodiment, for generating a complex local signal of a frequency Fc1=Fif2 (containing a real component "C1(t)=cos(2π×Fc1×t)" and an imaginary component "S1(t)=sin(2π×Fc1×t)" whose phase is 90 degrees delayed from that of the real component), and multipliers 63b, 63c, 63d and 63e, a subtracter 63f and an adder 63g for performing multiplication, subtraction and addition operations with respect to the output signal from the roll-off filter 62 and the complex local signal generated by the local oscillator 63a, respectively.

An interpolation band pass filter 68 interpolates and band pass filters the complex signal from the frequency converter 63. The interpolation band pass filter 68 includes real and imaginary interpolators 64a and 64b each for multiplying a sampling frequency Fs1 of a corresponding one of real and imaginary components of the complex signal by N to convert it into a sampling frequency Fs2=Fs1×N. The interpolation band pass filter 68 further includes multipliers 66a and 66b for multiplying a real component "C2(t)=cos(2π× Fc2×t)" and an imaginary component "S2(t)=sin(2π×Fc2× t)" whose phase is 90 degrees delayed from that of the real component, contained in an output signal from the NCO 70a of the first embodiment, by a filter coefficient of a low pass filter 65, respectively, and real and imaginary band pass filters 67a and 67b, a subtracter 67c and an adder 67d for performing band pass filtering, subtraction and addition operations with respect to output signals from the interpolators 64a and 64b on the basis of output signals from the multipliers 66a and 66b, respectively.

A real DAC 69a and imaginary DAC 69b cooperate to convert a digital signal of the center frequency Fif2 from the interpolation band pass filter 68 into a complex analog IF signal of a center frequency Fifa.

A local oscillator 70 includes the NCO 70a of the first embodiment, a DAC 70b for digital/analog-converting an output signal from the NCO 70a, and a PLL circuit 70c for receiving an output signal from the DAC 70b as a reference signal. A quadrature modulator 71 frequency-converts the complex analog IF signal of the center frequency Fifa from the real DAC 69a and imaginary DAC 69b to output a transmit signal (real signal) of a target center frequency Frf. The quadrature modulator 71 includes multipliers 71a and 71b for multiplying real and imaginary components of the complex analog IF signal from the real DAC 69a and imaginary DAC 69b by a real component "C3(t)=cos(2π× Fcp×t)" and an imaginary component "S3(t)=sin(2π×Fcp× t)" whose phase is 90 degrees delayed from that of the real component, contained in a complex analog local signal of a frequency Fcp output from the local oscillator 70, respectively, and a subtracter 71c for subtracting output signals from the multipliers 71a and 71b from each other.

Assuming that a multiplication ratio of the PLL circuit 70c is P and an output frequency of the NCO 70a is Fc2, the local oscillator 70 outputs an analog local signal of a frequency Fcp=Frf−Fifa=Fc2×P. Also, a frequency setting step FDP of the analog local signal (frequency setting interval of the quadrature modulator 71) is a multiplication of a frequency setting step FD of the NCO 70a by P.

For example, assuming that a desired frequency setting interval FD of a transmit signal is above a frequency setting interval FDP of the quadrature modulator 71 and is indivisible by it; the transmitter is operated in the following manner. In this case, if K1, K2 and L2 are arbitrary integers, the frequency converter 63 sets phase difference data φ1 to the local oscillator 63a using the NCO of the first embodiment to a value of φ1=Fc1/FD1=Fc1/(FD mod FDP)×K1. The frequency converter 63 converts a complex signal (containing baseband signal components I and Q) of a sampling frequency Fs1 output from the modulator 61 into a complex signal of a center frequency Fif2 using a complex local signal of a frequency Fc1 output from the local oscillator 63a and set to a frequency setting interval of an FD1 step, where FD1=(FD mod FDP)/K1. Here, the local oscillator 63a outputs the complex local signal of the frequency Fc1 by accumulating the phase difference data by a modulo operation taking the nearest integer of M1 as a modulus, where M1=Fs1/(FD mod FDP)×K1.

Also, the quadrature modulator 71 sets phase difference data φ2 to the NCO 70a of the first embodiment operating at a sampling frequency Fs to a value of φ2=Fc2/FDP=Fc2/FD×K2/L2. The quadrature modulator 71 converts an analog IF signal of a center frequency Fifa, generated by digital/analog-converting a digital IF signal of the center frequency Fif2 by the real DAC 69a and imaginary DAC 69b, into a transmit signal (real signal) of a target center frequency Frf using an analog local signal of a frequency Fcp output from the local oscillator 70 and set to a frequency setting interval of an FDP step, where FDP=FD/K2×L2. The local oscillator 70 outputs the analog local signal of the frequency Fcp by accumulating the phase difference data by a modulo operation taking the nearest integer of M2 as a modulus, where M2=Fs/FD×K2/L2×P.

However, for example, assuming that a desired frequency setting interval FD of a transmit signal is below a frequency setting interval FDP of the quadrature modulator 71 and FDP is indivisible by FD, the frequency converter 63 sets phase difference data φ1 to the local oscillator 63a using the NCO of the first embodiment to a value of φ1=Fc1/FD1=Fc1/(FDP mod FD)×K1. Then, the frequency converter 63 converts a complex signal (containing baseband signal components I and Q) of a sampling frequency Fs1 output from the modulator 61 into a complex signal of a center frequency Fif2 using a complex local signal of a frequency Fc1 output from the local oscillator 63a and set to a frequency setting interval of an FD1 step, where FD1=(FDP mod FD)/K1. Here, the local oscillator 63a outputs the complex local signal of the frequency Fc1 by accumulating the phase difference data by a modulo operation taking the nearest integer of M1 as a modulus, where M1=Fs1/(FDP mod FD)×K1.

Also, the quadrature modulator 71 sets phase difference data φ2 to the NCO 70a of the first embodiment operating at a sampling frequency Fs to a value of φ2=Fc2/FDP=Fc2/FD×K2/L2. Then, the quadrature modulator 71 converts an analog IF signal of a center frequency Fifa, generated by digital/analog-converting a digital IF signal of the center frequency Fif2 by the real DAC 69a and imaginary DAC 69b, into a transmit signal (real signal) of a target center frequency Frf using an analog local signal of a frequency Fcp output from the local oscillator 70 and set to a frequency setting interval of an FDP step, where FDP=FD/K2×L2. The local oscillator 70 outputs the analog local signal of the frequency Fcp by accumulating the phase difference data by a modulo operation taking the nearest integer of M2 as a modulus, where M2=Fs/FD×K2/L2×P.

Alternatively, for example, assuming that a desired frequency setting interval FD of a transmit signal is higher than or equal to a frequency setting interval FDP of the quadrature modulator 71 and is evenly divisible by it, or that FD is lower than FDP and FDP is evenly divisible by FD, the transmitter is operated in the following manner. In this case, the frequency converter 63 sets phase difference data φ1 to the local oscillator 63a using the NCO of the first embodiment to a value of φ1=Fc1/FD1=Fc1/FD×K1. The frequency converter 63 converts a complex signal (containing baseband signal components I and Q) of a sampling frequency Fs1 output from the modulator 61 into a complex signal of a center frequency Fif2 using a complex local signal of a frequency Fc1 output from the local oscillator 63a and set to a frequency setting interval of an FD1 step, where FD1=FD/K1. Here, the local oscillator 63a outputs the complex local signal of the frequency Fc1 by accumulating the phase difference data by a modulo operation taking the nearest integer of M1 as a modulus, where M1=Fs1/FD×K1.

Also, the quadrature modulator 71 sets phase difference data φ2 to the NCO 70a of the first embodiment operating at a sampling frequency Fs to a value of φ2=Fc2/FDP=Fc2/FD×K2/L2. Then, the quadrature modulator 71 converts an analog IF signal of a center frequency Fifa, generated by digital/analog-converting a digital IF signal of the center frequency Fif2 by the real DAC 69a and imaginary DAC 69b, into a transmit signal (real signal) of a target center frequency Frf using an analog local signal of a frequency Fcp output from the local oscillator 70 and set to a frequency setting interval of an FDP step, where FDP=FD/K2×L2. Here, the local oscillator 70 outputs the analog local signal of the frequency Fcp by accumulating the phase difference data by a modulo operation taking the nearest integer of M2 as a modulus, where M2=Fs/FD×K2/L2×P.

However, in the case where a multiple of the frequency setting interval FDP of the quadrature modulator 71 is equal to that of the frequency setting interval FD of the transmit signal, the transmitter with the above-described configuration can frequency-convert the transmit signal into the transmit signal (real signal) of the target center frequency Frf by means of only the quadrature modulator 71. In this case, the frequency conversion by the frequency converter 63 may be stopped.

In the transmitter of the present embodiment, in the case where the frequency setting interval FDP of the quadrature modulator 71 is settable at a step lower than or equal to the desired frequency setting interval FD of the transmit signal, each frequency can be output by merely changing the setting of frequency data (phase difference data) to the NCO of the local oscillator 70. Therefore, a data setting time of a controller that controls the transmitter can be reduced compared with a conventional transmitter and the frequency data to the NCO can be computed in a simpler manner.

As described above, the NCO of the first embodiment uses the nearest integer of M, where M=Fs/FD×K/L, on the assumption that Fs is a sampling frequency of an output signal from the NCO, FD is the upper limit of a desired frequency setting interval of the output signal and K and L are arbitrary integers. The phase calculator 1b generates phase data by performing a modulo operation taking the integral M as a modulus with respect to input phase difference data and phase data from the phase register 1a. The ROM 2 stores a phase/amplitude conversion table including M amplitude data and outputs amplitude data corresponding to the generated phase data through its data terminal. Therefore, it is possible to realize a low-spurious NCO which provides its output signal set to a frequency setting interval of a dF step, where dF=FD/K×L.

Therefore, because a low-spurious NCO, which provides its output signal set to a frequency setting interval lower than or equal to a desired frequency setting interval is realized on the basis of only low-capacity, amplitude data of M number that is smaller than a conventional one, it can be reduced in power consumption and cost.

Further, it is possible to realize the digital down-converter, the digital up-converter, the receiver with the demodulator, and the transmitter with the modulator of the second to eighth embodiments using the NCO of the first embodiment. As a result, the digital down-converter, digital up-converter, receiver, or transmitter can be reduced in power consumption and cost compared with a conventional one.

As apparent from the above description, if the upper limit of a desired frequency setting interval of an output signal is FD, and K and L are arbitrary integers, a phase accumulator generates phase data by accumulating input phase difference data by a modulo operation taking the nearest integer of M as a modulus, where M=Fs/FD×K/L, and outputs the generated phase data as an address input to a phase/amplitude conversion table. As a result, the phase/amplitude conversion table outputs amplitude data corresponding to the input phase data as an output signal of the NCO set to a frequency setting interval of a dF step, where dF=FD/K×L.

Therefore, a low-spurious NCO, which provides its output signal set to a frequency setting interval lower than or equal to a desired frequency setting interval, can be realized on the basis of only low-capacity, amplitude data of M number that is smaller than a conventional one, so it can be reduced in power consumption and cost.

According to a digital down-converter of the present invention, a frequency converter frequency-converts an input signal using a frequency signal output from the NCO of claim 1 as a local oscillator and set to a frequency setting interval of a dF step, where dF=FD/K×L. In the case where a desired frequency setting interval FD of the input signal is higher than or equal to a frequency setting interval dF of the frequency converter and is evenly divisible by it, the digital down-converter can convert the frequency of the input signal input thereto at the frequency setting interval FD into a desired frequency within the range of an allowable frequency deviation.

Therefore, the use of the low-spurious NCO which is realized on the basis of only low-capacity, amplitude data of M number that is smaller than a conventional one, where M=Fs/FD×K/L, and provides its output signal set to a frequency setting interval lower than or equal to a desired frequency setting interval can reduce power consumption and cost of the digital down-converter that can convert the frequency of the input signal input thereto at the desired frequency setting interval into a desired frequency within the range of an allowable frequency deviation.

According to an alternative digital down-converter of the present invention, one of two frequency converters provided for frequency conversions includes a low-spurious NCO which is realized on the basis of only M1 low-capacity amplitude data and provides its output signal set to a frequency setting interval lower than or equal to a desired frequency setting interval, and the other includes a low-spurious NCO which is realized on the basis of only M2 low-capacity amplitude data and provides its output signal set to a frequency setting interval lower than or equal to a desired frequency setting interval. The digital down-converter is able to cope with the case where a frequency setting interval FD of an input signal is above a frequency setting interval FD1 of the first frequency converter and is indivisible by it, the case where the frequency setting interval FD is below the frequency setting interval FD1 and FD1 is indivisible by FD, and the case where the frequency setting interval FD is higher than or equal to the frequency setting interval FD1 and is evenly divisible by it, or FD is lower than FD1 and FD1 is evenly divisible by FD, respectively.

Therefore, the use of the two low-spurious NCOs which are realized on the basis of only low-capacity, amplitude data of M1 and M2 numbers that are each smaller than a conventional one and provide their output signals each set to a frequency setting interval lower than or equal to a desired frequency setting interval can reduce power consumption and cost of the digital down-converter that can convert the frequency of the input signal input thereto at the desired frequency setting interval into a desired frequency within the range of an allowable frequency deviation.

According to yet another digital down-converter of the present invention, in the case where a multiple of the frequency setting interval FD1 of the first frequency converter is equal to that of the frequency setting interval FD of the input signal, the digital down-converter can convert the frequency of the input signal input thereto at the frequency setting interval FD into a desired frequency within the range of an allowable frequency deviation by means of only the first frequency converter.

Therefore, it is possible to reduce power consumption of the digital down-converter that can convert the frequency of the input signal input thereto at the desired frequency setting interval into a desired frequency within the range of an allowable frequency deviation.

According to another embodiment of a digital up-converter of the present invention, a frequency converter frequency-converts an input signal using a frequency signal output from the NCO of claim 1 as a local oscillator and set to a frequency setting interval of a dF step, where dF=FD/K×L. In the case where a desired frequency setting interval FD of an output signal is higher than or equal to a frequency setting interval dF of the frequency converter and is evenly divisible by it, the digital up-converter can set the frequency setting interval of its output signal to FD.

Therefore, the use of the low-spurious NCO which is realized on the basis of only low-capacity, amplitude data of M number that is smaller than a conventional one, where M=Fs/FD×K/L, and provides its output signal set to a frequency setting interval lower than or equal to a desired frequency setting interval can reduce power consumption and cost of the digital up-converter that can output a signal of the desired frequency setting interval.

According to alternative digital up-converters of the present invention, one of two frequency converters provided for frequency conversions includes a low-spurious NCO which is realized on the basis of only M1 low-capacity amplitude data and provides its output signal set to a frequency setting interval lower than or equal to a desired frequency setting interval, and the other includes a low-spurious NCO which is realized on the basis of only M2 low-capacity amplitude data and provides its output signal set to a frequency setting interval lower than or equal to a desired frequency setting interval. The digital up-converter is able to cope with the case where a frequency setting interval FD of an output signal is above a frequency setting interval FD2 of the second frequency converter and is indivisible by it, the case where the frequency setting interval FD is below the frequency setting interval FD2 and FD2 is indivisible by FD, and the case where the frequency setting interval FD is higher than or equal to the frequency setting interval FD2 and is evenly divisible by it, or FD is lower than FD2 and FD2 is evenly divisible by FD, respectively.

Therefore, the use of the two low-spurious NCOs which are realized on the basis of only low-capacity, amplitude data of M1 and M2 numbers that are each smaller than a conventional one and provide their output signals each set to a frequency setting interval lower than or equal to a desired frequency setting interval can reduce power consumption and cost of the digital up-converter that can output a signal of the desired frequency setting interval.

According to a digital up-converter of the present invention, in the case where a multiple of the frequency setting interval FD2 of the second frequency converter is equal to that of the frequency setting interval FD of the output signal, the digital up-converter can set the frequency setting interval of its output signal to FD by means of only the second frequency converter.

Therefore, it is possible to reduce power consumption of the digital up-converter that can output a signal of the desired frequency setting interval.

According to the preferred embodiments of the receiver of the present invention, one of two frequency converters provided for frequency conversion of a received signal into an input signal desired by a demodulator includes a low-spurious NCO which is realized on the basis of only M1 low-capacity amplitude data and provides its output signal set to a frequency setting interval lower than or equal to a desired frequency setting interval, and the other includes a low-spurious NCO which is realized on the basis of only M2 low-capacity amplitude data and provides its output signal set to a frequency setting interval lower than or equal to a desired frequency setting interval. The receiver is able to cope with the case where a frequency setting interval FD of an input signal is above a frequency setting interval FDP of the first frequency converter and is indivisible by it, the case where the frequency setting interval FD is below the frequency setting interval FDP and FDP is indivisible by FD, and the case where the frequency setting interval FD is higher than or equal to the frequency setting interval FDP and is evenly divisible by it, or FD is lower than FDP and FDP is evenly divisible by FD, respectively.

Therefore, the use of the two low-spurious NCOs which are realized on the basis of only low-capacity, amplitude data of M1 and M2 numbers that are each smaller than a conventional one and provide their output signals each set to a frequency setting interval lower than or equal to a desired frequency setting interval can reduce power consumption and cost of the receiver that can accurately convert the frequency of the received signal input thereto at the frequency setting interval FD into that desired by the demodulator.

According to an alternate embodiment of the receiver of the present invention, in the case where a multiple of the frequency setting interval FD1 of the first frequency converter is equal to that of the frequency setting interval FD of the received signal, the receiver can accurately convert the frequency of the received signal input thereto at the frequency setting interval FD into that desired by the demodulator by means of only the first frequency converter.

Therefore, it is possible to reduce power consumption of the receiver that can accurately convert the frequency of the received signal input thereto at the frequency setting interval FD into that desired by the demodulator.

According to preferred embodiments of a transmitter of the present invention, one of two frequency converters provided for frequency conversion of a transmit signal from a modulator into a target frequency includes a low-spurious NCO which is realized on the basis of only M1 low-capacity amplitude data and provides its output signal set to a frequency setting interval lower than or equal to a desired frequency setting interval, and the other includes a low-spurious NCO which is realized on the basis of only M2 low-capacity amplitude data and provides its output signal set to a frequency setting interval lower than or equal to a desired frequency setting interval. The transmitter is able to cope with the case where a frequency setting interval FD of an output signal is above a frequency setting interval FDP of the second frequency converter and is indivisible by it, the case where the frequency setting interval FD is below the frequency setting interval FDP and FDP is indivisible by FD, and the case where the frequency setting interval FD is higher than or equal to the frequency setting interval FDP and is evenly divisible by it, or FD is lower than FDP and FDP is evenly divisible by FD, respectively.

Therefore, the use of the two low-spurious NCOs which are realized on the basis of only low-capacity, amplitude data of M1 and M2 numbers that are each smaller than a conventional one and provide their output signals each set to a frequency setting interval lower than or equal to a desired frequency setting interval can reduce power consumption and cost of the transmitter that can accurately convert the frequency of the baseband transmit signal from the modulator into a target transmit signal frequency.

According to an alternative embodiment transmitter of the present invention, in the case where a multiple of the frequency setting interval FD2 of the second frequency converter is equal to that of the frequency setting interval FD of the transmit signal, the transmitter can accurately convert the frequency of the baseband transmit signal from the modulator into that of a target transmit signal by means of only the second frequency converter.

Therefore, it is possible to reduce power consumption of the transmitter that can accurately convert the frequency of the baseband transmit signal from the modulator into a target transmit signal frequency.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A numerical control oscillator comprising: a phase accumulator for accumulating input phase difference data to generate phase data, said phase accumulator including a register for storing and outputting said phase data, and a calculator for one of adding and subtracting said input phase difference data and said phase data from said register; and a memory for storing a phase/amplitude conversion table to output amplitude data corresponding to said phase data generated by said phase accumulator, said numerical control oscillator outputting a signal of a sampling frequency Fs, wherein: if an upper limit of a desired frequency setting interval of an output signal is FD and, K and L are arbitrary integers, said calculator of said phase accumulator is performing one of adding and subtracting said input phase difference data and said phase data from said register by a modulo operation taking a nearest integer of M as a modulus, where M=Fs/FD×K/L; and said phase/amplitude conversion table outputs a signal set to a frequency setting interval of a dF step, where dF=FD/K×L.

2. A digital down-converter comprising a frequency converter, the frequency converter including a numerical control oscillator as a local oscillator and serving to frequency-convert an input signal sampled at a sampling frequency Fs, said digital down-converter converting and outputting said input signal into an output signal with a frequency lower than that of said input signal, said numerical control oscillator having:

a phase accumulator for accumulating input phase difference data to generate phase data, said phase accumulator including a register for storing and outputting said phase data, and a calculator for one of adding and subtracting said input phase difference data and said phase data from said register; and a memory for storing a phase/amplitude conversion table to output amplitude data corresponding to said phase data generated by said phase accumulator, said numerical control oscillator outputting a signal of the sampling frequency Fs, wherein, if a desired frequency setting interval of said input signal is FD and K and L are arbitrary integers, said frequency converter is adapted to frequency-convert said input signal using a specific signal output from said local oscillator and set to a frequency setting interval of a dF step, where dF=FD/K×L, said local oscillator outputting the specific signal by accumulating said phase difference data by a modulo operation taking a nearest integer of M as a modulus, where M=Fs/FD×K/L.

3. A digital down-converter comprising a first frequency converter, the first frequency converter including a numerical control oscillator as a first local oscillator and serving to frequency-convert an input signal sampled at a sampling frequency Fs1, and a second frequency converter, the second frequency converter including an identical numerical control oscillator as included in the first frequency converter as a second local oscillator and serving to secondarily frequency-convert an output signal from said first frequency converter, said digital down-converter converting and outputting said input signal into an output signal with a frequency lower than that of said input signal by two frequency conversions, said numerical control oscillator having:

a phase accumulator for accumulating input phase difference data to generate phase data, said phase accumulator including a register for storing and outputting said phase data, and a calculator for one of adding and subtracting said input phase difference data and said phase data from said register; and a memory for storing a phase/amplitude conversion table to output amplitude data corresponding to said phase data generated by said phase accumulator, said numerical control oscillator outputting a signal of the sampling frequency, wherein:

if a desired frequency setting interval of said input signal is FD and K1, K2 and L1 are arbitrary integers, said first frequency converter is adapted to frequency-convert said input signal using a first specific signal output from said first local oscillator and set to a frequency setting interval of an FD1 step, where FD1=FD/K1×L1, said first local oscillator outputting the first specific signal by accumulating said phase difference data by a modulo operation taking a nearest integer of M1 as a modulus, where M1=Fs1/FD×K1/L1; and said second frequency converter is adapted to, if a sampling frequency of the output signal from said first frequency converter is Fs2, frequency-convert said output signal from said first frequency converter using a second specific signal output from said second local oscillator and set to a frequency setting interval of an FD2 step, where FD2=(FD mod FD1)/K2, said second local oscillator outputting the second specific signal by accumulating said phase difference data by a modulo operation taking a nearest integer of M2 as a modulus, where M2=Fs2/(FD mod FD1)×K2.

4. The digital down-converter as set forth in claim 3, wherein said second frequency converter is adapted to stop the frequency conversion.

5. A digital down-converter comprising a first frequency converter, the first frequency converter including a numerical control oscillator as a first local oscillator and serving to frequency-convert an input signal sampled at a sampling frequency Fs1, and a second frequency converter, the second frequency converter including an identical numerical control oscillator as the first frequency converter as a second local oscillator and serving to secondarily frequency-convert an output signal from said first frequency converter, said digital down-converter converting and outputting said input signal into an output signal with a frequency lower than that of said input signal by two frequency conversions, said numerical control oscillator having:

a phase accumulator for accumulating input phase difference data to generate phase data, said phase accumulator including a register for storing and outputting said phase data, and a calculator for one of adding and subtracting said input phase difference data and said phase data from said register; and a memory for storing a phase/amplitude conversion table to output amplitude data corresponding to said phase data generated by said phase accumulator, said numerical control oscillator outputting a signal of the sampling frequency, wherein:

if a desired frequency setting interval of said input signal is FD, and K1, K2 and L1 are arbitrary integers, said first frequency converter is adapted to frequency-convert said input signal using a first specific signal output from said first local oscillator and set to a frequency setting interval of an FD1 step, where FD1=FD/K1×L1, said first local oscillator outputting the first specific signal by accumulating said phase difference data by a modulo operation taking a nearest integer of M1 as a modulus, where M1=Fs1/FD×K1/L1; and said second frequency converter is adapted to, if a sampling frequency of the output signal from said first frequency converter is Fs2, frequency-convert said output signal from said first frequency converter using a second specific signal output from said second local oscillator and set to a frequency setting interval of an FD2 step, where FD2=(FD1 mod FD)/K2, said second local oscillator outputting the second specific signal by accumulating said phase difference data by a modulo operation taking a nearest integer of M2 as a modulus, where M2=Fs2/(FD1 mod FD)×K2.

6. The digital down-converter as set forth in claim 5, wherein said second frequency converter is adapted to stop the frequency conversion.

7. A digital down-converter comprising a first frequency converter, the first frequency converter including a numerical control oscillator as a first local oscillator and serving to frequency-convert an input signal sampled at a sampling frequency Fs1, and a second frequency converter, the second frequency converter including an identical numerical control oscillator as in the first frequency converter as a second local oscillator and serving to secondarily frequency-convert an output signal from said first frequency converter, said digital down-converter converting and outputting said input signal into an output signal with a frequency lower than that of said input signal by two frequency conversions, said numerical control oscillator having:

a phase accumulator for accumulating input phase difference data to generate phase data, said phase accumulator including a register for storing and outputting said phase data, and a calculator for one of adding and subtracting said input phase difference data and said phase data from said register; and a memory for storing a phase/amplitude conversion table to output amplitude data corresponding to said phase data generated by said phase accumulator, said numerical control oscillator outputting a signal of the sampling frequency, wherein:

if a desired frequency setting interval of said input signal is FD and K1, K2 and L1 are arbitrary integers, said first frequency converter is adapted to frequency-convert said input signal using a first specific signal output from said first local oscillator and set to a frequency setting interval of an FD1 step, where FD1=FD/K1×L1, said first local oscillator outputting the first specific signal by accumulating said phase difference data by a modulo operation taking a nearest integer of M1 as a modulus, where M1=Fs1/FD×K1/L1; and said second frequency converter is adapted to, if a sampling frequency of the output signal from said first frequency converter is Fs2, frequency-convert said output signal from said first frequency converter using a second specific signal output from said second local oscillator and set to a frequency setting interval of an FD2 step, where FD2=FD/K2, said second local oscillator outputting the second specific signal by accumulating said phase difference data by a modulo operation taking a nearest integer of M2 as a modulus, where M2=Fs2/FD×K2.

8. The digital down-converter as set forth in claim 7, wherein said second frequency converter is adapted to stop the frequency conversion.

9. A digital up-converter comprising a frequency converter, the frequency converter including a numerical control oscillator as a local oscillator and serving to frequency-convert an input signal, said digital up-converter converting said input signal into a signal with a frequency higher than that of said input signal and outputting the converted signal as an output signal sampled at a sampling frequency Fs, said numerical control oscillator having:

a phase accumulator for accumulating input phase difference data to generate phase data, said phase accumulator including a register for storing and outputting said phase data, and a calculator for one of adding and subtracting said input phase difference data and said phase data from said register; and a memory for storing a phase/amplitude conversion table to output amplitude data corresponding to said phase data generated by said phase accumulator, said numerical control oscillator outputting a signal of the sampling frequency Fs, wherein, if a desired frequency setting interval of said output signal is FD and K and L are arbitrary integers, said frequency converter is adapted to frequency-convert said input signal using a specific signal output from said local oscillator and set to a frequency setting interval of a dF step, where dF=FD/K×L, said local oscillator outputting the specific signal by accumulating said phase difference data by a modulo operation taking a nearest integer of M as a modulus, where M=Fs/FD×K/L.

10. A digital up-converter comprising a first frequency converter, the first frequency converter including a numerical control oscillator as a first local oscillator and serving to frequency-convert an input signal, and a second frequency converter, the second frequency converter including an identical numerical control oscillator as included in the first frequency converter as a second local oscillator and serving to secondarily frequency-convert an output signal from said first frequency converter, said digital up-converter performing two frequency conversions to convert said input signal into a signal with a frequency higher than that of said input signal and output the converted signal as an output signal sampled at a sampling frequency Fs2, said numerical control oscillator having:

a phase accumulator for accumulating input phase difference data to generate phase data, said phase accumulator including a register for storing and outputting said phase data, and a calculator for one of adding and subtracting said input phase difference data and said phase data from said register; and a memory for storing a phase/amplitude conversion table to output amplitude data corresponding to said phase data generated by said phase accumulator, said numerical control oscillator outputting a signal of the sampling frequency, wherein:

if a desired frequency setting interval of said output signal is FD, and K1, K2, and L2 are arbitrary integers, said second frequency converter is adapted to frequency-convert the output signal from said first frequency converter using a first specific signal output from said second local oscillator and set to a frequency setting interval of an FD2 step, where FD2=FD/K2×L2, said second local oscillator outputting the first specific signal by accumulating said phase difference data by a modulo operation taking a nearest integer of M2 as a modulus, where M2=Fs2/FD×K2/L2; and said first frequency converter is adapted to, if a sampling frequency of said input signal is Fs1, frequency-convert said input signal using a second specific signal output from said first local oscillator and set to a frequency setting interval of an FD1 step, where FD1=(FD mod FD2)/K1, said first local oscillator outputting the second specific signal by accumulating said phase difference data by a modulo operation taking a nearest integer of M1 as a modulus, where M1=Fs1/(FD mod FD2)×K1.

11. The digital up-converter as set forth in claim 10, wherein said first frequency converter is adapted to stop the frequency conversion.

12. A digital up-converter comprising a first frequency converter, the first frequency converter including a numerical control oscillator as a first local oscillator and serving to frequency-convert an input signal, and a second frequency converter, the second frequency converter including an identical numerical control oscillator as included in the first frequency converter as a second local oscillator and serving to secondarily frequency-convert an output signal from said first frequency converter, said digital up-converter performing two frequency conversions to convert said input signal into a signal with a frequency higher than that of said input signal and output the converted signal as an output signal sampled at a sampling frequency Fs2, said numerical control oscillator having:

a phase accumulator for accumulating input phase difference data to generate phase data, said phase accumulator including a register for storing and outputting said phase data, and a calculator for one of adding and subtracting said input phase difference data and said phase data from said register; and a memory for storing a phase/amplitude conversion table to output amplitude data corresponding to said phase data generated by said phase accumulator, said numerical control oscillator outputting a signal of the sampling frequency, wherein:

if a desired frequency setting interval of said output signal is FD and K1, K2 and L2 are arbitrary integers, said second frequency converter is adapted to frequency-convert the output signal from said first frequency converter using a first specific signal output from said second local oscillator and set to a frequency setting interval of an FD2 step, where FD2=FD/K2×L2, said second local oscillator outputting the first specific signal by accumulating said phase difference data by a modulo operation taking a nearest integer of M2 as a modulus, where M2=Fs2/FD×K2/L2; and said first frequency converter is adapted to, if a sampling frequency of said input signal is Fs1, frequency-convert said input signal using a second specific signal output from said first local oscillator and set to a frequency setting interval of an FD1 step, where FD1=(FD2 mod FD)/K1, said first local oscillator outputting the second specific signal by accumulating said phase difference data by a modulo operation taking a nearest integer of M1 as a modulus, where M1=Fs1/(FD2 mod FD)×K1.

13. The digital up-converter as set forth in claim 12, wherein said first frequency converter is adapted to stop the frequency conversion.

14. A digital up-converter comprising a first frequency converter, the first frequency converter including a numerical control oscillator as a first local oscillator and serving to frequency-convert an input signal, and a second frequency converter, the second frequency converter including an identical numerical control oscillator as included in the first frequency converter as a second local oscillator and serving to secondarily frequency-convert an output signal from said first frequency converter, said digital up-converter performing two frequency conversions to convert said input signal into a signal with a frequency higher than that of said input signal and output the converted signal as an output signal sampled at a sampling frequency Fs2, said numerical control oscillator having:

a phase accumulator for accumulating input phase difference data to generate phase data, said phase accumulator including a register for storing and outputting said phase data, and a calculator for one of adding and subtracting said input phase difference data and said phase data from said register; and a memory for storing a phase/amplitude conversion table to output amplitude data corresponding to said phase data generated by said phase accumulator, said numerical control oscillator outputting a signal of the sampling frequency, wherein:

if a desired frequency setting interval of said output signal is FD and K1, K2 and L2 are arbitrary integers, said second frequency converter is adapted to frequency-convert the output signal from said first frequency converter using a first specific signal output from said second local oscillator and set to a frequency setting interval of an FD2 step, where FD2=FD/K2×L2, said second local oscillator outputting the first specific signal by accumulating said phase difference data by a modulo operation taking a nearest integer of M2 as a modulus, where M2=Fs2/FD×K2/L2; and said first frequency converter is adapted to, if a sampling frequency of said input signal is Fs1, frequency-convert said input signal using a second specific signal output from said first local oscillator and set to a frequency setting interval of an FD1 step, where FD1=FD/K1, said first local oscillator outputting the second specific signal by accumulating said phase difference data by a modulo operation taking a nearest integer of M1 as a modulus, where M1=Fs1/FD×K1.

15. The digital up-converter as set forth in claim 14, wherein said first frequency converter is adapted to stop the frequency conversion.

16. A receiver comprising a first frequency converter, the first frequency converter including a first local oscillator and serving to frequency-convert a received signal, said first local oscillator including a numerical control oscillator operating at a sampling frequency Fs and a phase locked loop (PLL) circuit having a multiplication ratio P, wherein P is an integer, and acting to receive the output signal from the numerical control oscillator as a reference signal, a second frequency converter, the second frequency converter including an identical numerical control oscillator as included in the first local oscillator as a second local oscillator and serving to secondarily frequency-convert an output signal from said first frequency converter, and a demodulator for demodulating an output signal from said second frequency converter to extract received data therefrom, said receiver converting said received signal into a baseband received signal with a frequency lower than that of said received signal by two frequency conversions and extracting the received data from the converted baseband received signal, said numerical control oscillator having:

a phase accumulator for accumulating input phase difference data to generate phase data, said phase accumulator including a register for storing and outputting said phase data, and a calculator for one of adding and subtracting said input phase difference data and said phase data from said register; and a memory for storing a phase/amplitude conversion table to output amplitude data corresponding to said phase data generated by said phase accumulator, said numerical control oscillator outputting a signal of the sampling frequency, wherein:

if a desired frequency setting interval of said received signal is FD and K1, K2 and L1 are arbitrary integers, said first frequency converter is adapted to frequency-convert said received signal using a first specific signal output from said first local oscillator and set to a frequency setting interval of an FDP step, where FDP=FD/K1×L1, said first local oscillator outputting the first specific signal by accumulating said phase difference data by a modulo operation taking a nearest integer of M1 as a modulus, where M1=Fs/FD×K1/L1×P; and said second frequency converter is adapted to, if a sampling frequency of the output signal from said first frequency converter is Fs1, frequency-convert said output signal from said first frequency converter using a second specific signal output from said second local oscillator and set to a frequency setting interval of an FD2 step, where FD2=(FD mod FDP)/K2, said second local oscillator outputting the second specific signal by accumulating said phase difference data by a modulo operation taking a nearest integer of M2 as a modulus, where M2=Fs1/(FD mod FDP)×K2.

17. The receiver as set forth in claim 16, wherein said second frequency converter is adapted to stop the frequency conversion.

18. A receiver comprising a first frequency converter including a first local oscillator and serving to frequency-convert a received signal, said first local oscillator including a numerical control oscillator operating at a sampling frequency Fs and a PLL circuit having a multiplication ratio P, wherein P is an integer, and acting to receive the output signal from the numerical control oscillator as a reference signal, a second frequency converter including an identical numerical control oscillator as included in the first local oscillator as a second local oscillator and serving to secondarily frequency-convert an output signal from said first frequency converter, and a demodulator for demodulating an output signal from said second frequency converter to extract received data therefrom, said receiver converting said received signal into a baseband received signal with a frequency lower than that of said received signal by two frequency conversions and extracting the received data from the converted baseband received signal, said numerical control oscillator having:

a phase accumulator for accumulating input phase difference data to generate phase data, said phase accumulator including a register for storing and outputting said phase data, and a calculator for one of adding and subtracting said input phase difference data and said phase data from said register; and a memory for storing a phase/amplitude conversion table to output amplitude data corresponding to said phase data generated by said phase accumulator, said numerical control oscillator outputting a signal of the sampling frequency, wherein:

if a desired frequency setting interval of said received signal is FD, and K1, K2, and L1 are arbitrary integers, said first frequency converter is adapted to frequency-convert said received signal using a first specific signal output from said first local oscillator and set to a frequency setting interval of an FDP step, where FDP=FD/K1×L1, said first local oscillator outputting the first specific signal by accumulating said phase difference data by a modulo operation taking a nearest integer of M1 as a modulus, where M1=Fs/FD×K1/L1×P; and said second frequency converter is adapted to, if a sampling frequency of the output signal from said first frequency converter is Fs1, frequency-convert said output signal from said first frequency converter using a second specific signal output from said second local oscillator and set to a frequency setting interval of an FD2 step, where FD2=(FDP mod FD)/K2, said second local oscillator outputting the second specific signal by accumulating said phase difference data by a modulo operation taking a nearest integer of M2 as a modulus, where M2=Fs1/(FDP mod FD)×K2.

19. The receiver as set forth in claim 18, wherein said second frequency converter is adapted to stop the frequency conversion.

20. A receiver comprising a first frequency converter including a first local oscillator and serving to frequency-convert a received signal, said first local oscillator including a numerical control oscillator operating at a sampling frequency Fs and a PLL circuit having a multiplication ratio P, wherein P is an integer, and acting to receive the output signal from the numerical control oscillator as a reference signal, a second frequency converter including an identical numerical control oscillator as included in the first local oscillator as a second local oscillator and serving to secondarily frequency-convert an output signal from said first frequency converter, and a demodulator for demodulating an output signal from said second frequency converter to extract received data therefrom, said receiver converting said received signal into a baseband received signal with a frequency lower than that of said received signal by two frequency conversions and extracting the received data from the converted baseband received signal, said numerical control oscillator having:

a phase accumulator for accumulating input phase difference data to generate phase data, said phase accumulator including a register for storing and outputting said phase data, and a calculator for one of adding and subtracting said input phase difference data and said phase data from said register; and a memory for storing a phase/amplitude conversion table to output amplitude data corresponding to said phase data generated by said phase accumulator, said numerical control oscillator outputting a signal of the sampling frequency, wherein:

if a desired frequency setting interval of said received signal is FD, and K1, K2, and L1 are arbitrary integers, said first frequency converter is adapted to frequency-convert said received signal using a first specific signal output from said first local oscillator and set to a frequency setting interval of an FDP step, where FDP=FD/K1×L1, said first local oscillator outputting the first specific signal by accumulating said phase difference data by a modulo operation taking a nearest integer of M1 as a modulus, where M1=Fs/FD×K1/L1×P; and said second frequency converter is adapted to, if a sampling frequency of the output signal from said first frequency converter is Fs1, frequency-convert said output signal from said first frequency converter using a second specific signal output from said second local oscillator and set to a frequency setting interval of an FD2 step, where FD2=FD/K2, said second local oscillator outputting the second specific signal by accumulating said phase difference data by a modulo operation taking a nearest integer of M2 as a modulus, where M2=Fs1/FD×K2.

21. The receiver as set forth in claim 20, wherein said second frequency converter is adapted to stop the frequency conversion.

22. A transmitter comprising a modulator for modulating and outputting a baseband transmit signal based on transmit data, a first frequency converter including a numerical control oscillator as a first local oscillator and serving to frequency-convert the output signal from said modulator, a second frequency converter including a second local oscillator and serving to secondarily frequency-convert an output signal from said first frequency converter, said second local oscillator including an identical numerical control oscillator as included in the first frequency converter operating at a sampling frequency Fs and a PLL circuit having a multiplication ratio P, wherein P is an integer, and acting to receive the output signal from the numerical control oscillator as a reference signal, said transmitter converting and outputting said baseband transmit signal into a transmit signal with a frequency higher than that of said baseband transmit signal by two frequency conversions, said numerical control oscillator having:

a phase accumulator for accumulating input phase difference data to generate phase data, said phase accumulator including a register for storing and outputting said phase data, and a calculator for one of adding and subtracting said input phase difference data and said phase data from said register; and a memory for storing a phase/amplitude conversion table to output amplitude data corresponding to said phase data generated by said phase accumulator, said numerical control oscillator outputting a signal of the sampling frequency, wherein:

if a desired frequency setting interval of said transmit signal is FD, and K1, K2, and L2 are arbitrary integers, said second frequency converter is adapted to frequency-convert the output signal from said first frequency converter using a first specific signal output from said second local oscillator and set to a frequency setting interval of an FDP step, where FDP=FD/K2×L2, said second local oscillator outputting the first specific signal by accumulating said phase difference data by a modulo operation taking a nearest integer of M2 as a modulus, where M2=Fs/FD×K2/L2×P; and said first frequency converter is adapted to, if a sampling frequency of the output signal from said modulator is Fs1, frequency-convert said output signal from said modulator using a second specific signal output from said first local oscillator and set to a frequency setting interval of an FD1 step, where FD1=(FD mod FDP)/K1, said first local oscillator outputting the second specific signal by accumulating said phase difference data by a modulo operation taking a nearest integer of M1 as a modulus, where M1=Fs1/(FD mod FDP)×K1.

23. The transmitter as set forth in claim 22, wherein said first frequency converter is adapted to stop the frequency conversion.

24. A transmitter comprising a modulator for modulating and outputting a baseband transmit signal based on transmit data, a first frequency converter including a numerical control oscillator as a first local oscillator and serving to frequency-convert the output signal from said modulator, a second frequency converter including a second local oscillator and serving to secondarily frequency-convert an output signal from said first frequency converter, said second local oscillator including an identical numerical control oscillator as included in the first frequency converter operating at a sampling frequency Fs and a PLL circuit having a multiplication ratio P, wherein P is an integer, and acting to receive the output signal from the numerical control oscillator as a reference signal, said transmitter converting and outputting said baseband transmit signal into a transmit signal with a frequency higher than that of said baseband transmit signal by two frequency conversions, said numerical control oscillator having:

a phase accumulator for accumulating input phase difference data to generate phase data, said phase accumulator including a register for storing and outputting said phase data, and a calculator for one of adding and subtracting said input phase difference data and said phase data from said register; and a memory for storing a phase/amplitude conversion table to output amplitude data corresponding to said phase data generated by said phase accumulator, said numerical control oscillator outputting a signal of the sampling frequency, wherein:

if a desired frequency setting interval of said transmit signal is ED, and K1, K2, and L2 are arbitrary integers, said second frequency converter is adapted to frequency-convert the output signal from said first frequency converter using a first specific signal output from said second local oscillator and set to a frequency setting interval of an FDP step, where FDP=FD/K2×L2, said second local oscillator outputting the first specific signal by accumulating said phase difference data by a modulo operation taking a nearest integer of M2 as a modulus, where M2=Fs/FD×K2/L2×P; and said first frequency converter is adapted to, if a sampling frequency of the output signal from said modulator is Fs1, frequency-convert said output signal from said modulator using a second specific signal output from said first local oscillator and set to a frequency setting interval of an FD1 step, where FD1=(FDP mod FD)/K1, said first local oscillator outputting the second specific signal by accumulating said phase difference data by a modulo operation taking a nearest integer of M1 as a modulus, where M1=Fs1/(FDP mod FD)×K1.

25. The transmitter as set forth in claim 24, wherein said first frequency converter is adapted to stop the frequency conversion.

26. A transmitter comprising a modulator for modulating and outputting a baseband transmit signal based on transmit data, a first frequency converter including a numerical control oscillator as a first local oscillator and serving to frequency-convert the output signal from said modulator, a second frequency converter including a second local oscillator and serving to secondarily frequency-convert an output signal from said first frequency converter, said second local oscillator including an identical numerical control oscillator as included in the first frequency converter operating at a sampling frequency Fs and a PLL circuit having a multiplication ratio P, where P is an integer, and acting to receive the output signal from the numerical control oscillator of claim 1 as a reference signal, said transmitter converting and outputting said baseband transmit signal into a transmit signal with a frequency higher than that of said baseband transmit signal by two frequency conversions, wherein:

if a desired frequency setting interval of said transmit signal is FD, and K1, K2, and L2 are arbitrary integers, said second frequency converter is adapted to frequency-convert the output signal from said first frequency converter using a first specific signal output from said second local oscillator and set to a frequency setting interval of an FDP step, where FDP=FD/K2×L2, said second local oscillator outputting the first specific signal by accumulating said phase difference data by a modulo operation taking a nearest integer of M2 as a modulus, where M2=Fs/FD×K2/L2×P; and said first frequency converter is adapted to, if a sampling frequency of the output signal from said modulator is Fs1, frequency-convert said output signal from said modulator using a second specific signal output from said first local oscillator and set to a frequency setting interval of an FD1 step, where FD1=FD/K1, said first local oscillator outputting the second specific signal by accumulating said phase difference data by a modulo operation taking a nearest integer of M1 as a modulus, where M1=Fs1/FD×K1.

27. The transmitter as set forth in claim 26, wherein said first frequency converter is adapted to stop the frequency conversion.

* * * * *